(12) United States Patent
Kubo et al.

(10) Patent No.: US 10,636,648 B2
(45) Date of Patent: Apr. 28, 2020

(54) FILM DEPOSITION METHOD OF DEPOSITING FILM AND FILM DEPOSITION APPARATUS

(71) Applicant: Tokyo Electron Limited, Tokyo (JP)

(72) Inventors: Kazumi Kubo, Iwate (JP); Yutaka Takahashi, Iwate (JP); Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/198,087

(22) Filed: Nov. 21, 2018

(65) Prior Publication Data

US 2019/0172700 A1      Jun. 6, 2019

(30) Foreign Application Priority Data

Dec. 4, 2017   (JP) .................. 2017-232878

(51) Int. Cl.
| | |
|---|---|
| *H01L 21/31* | (2006.01) |
| *H01L 21/318* | (2006.01) |
| *H01L 21/67* | (2006.01) |
| *H01L 21/768* | (2006.01) |
| *H01L 21/311* | (2006.01) |

(Continued)

(52) U.S. Cl.
CPC .......... *H01L 21/0217* (2013.01); *H01J 37/00* (2013.01); *H01L 21/0228* (2013.01); *H01L 21/02211* (2013.01); *H01L 21/02274* (2013.01); *H01L 21/6719* (2013.01); *H01L 21/67748* (2013.01); *H01L 21/68764* (2013.01); *H01L 21/68771* (2013.01); *H01J 37/32* (2013.01); *H01L 21/0254* (2013.01); *H01L 2924/01017* (2013.01)

(58) Field of Classification Search
CPC .......... H01L 21/0217; H01L 21/02211; H01L 21/02274; H01L 21/0228; H01L 21/6719; H01L 21/67748; H01L 21/68764; H01L 21/68771; H01J 37/00
USPC ......................................... 438/793
See application file for complete search history.

(56) References Cited

U.S. PATENT DOCUMENTS

| | | |
|---|---|---|
| 8,900,963 B2 | 12/2014 | Sills et al. |
| 9,865,457 B2 | 1/2018 | Hasebe et al. |

(Continued)

FOREIGN PATENT DOCUMENTS

| | | |
|---|---|---|
| JP | 2012-138501 | 7/2012 |
| JP | 2013-135154 | 7/2013 |
| JP | 2017-092098 | 5/2017 |

*Primary Examiner* — Ly D Pham
(74) *Attorney, Agent, or Firm* — IPUSA, PLLC

(57) ABSTRACT

A film deposition method for depositing a silicon nitride film of selectively depositing on a flat surface of a substrate between minute recesses including a chlorine radical adsorbing step of supplying a chlorine containing gas that is activated onto a front surface of the substrate to cause the chlorine radical to be adsorbed entirely on the front surface of the substrate, a nitriding step of supplying a nitriding gas that is activated onto the substrate on which the chlorine radical adsorbs, causing the chlorine radical adsorbing on the flat surface, and nitride the flat surface from among the front surface of the substrate so as to form a silicon adsorption site, and a raw gas adsorbing step of supplying a raw gas that contains silicon and chlorine onto the substrate so as to cause the raw gas to adsorb onto the silicon adsorption site.

14 Claims, 16 Drawing Sheets

(51) Int. Cl.
  *H01L 21/02*     (2006.01)
  *H01L 21/687*    (2006.01)
  *H01J 37/00*     (2006.01)
  *H01L 21/677*    (2006.01)
  *H01J 37/32*     (2006.01)

(56) References Cited

U.S. PATENT DOCUMENTS

| | | |
|---|---|---|
| 10,026,606 B2 | 7/2018 | Kato et al. |
| 2006/0199399 A1 | 9/2006 | Muscat |
| 2007/0269982 A1 | 11/2007 | Rocklein et al. |
| 2008/0242097 A1 | 10/2008 | Boescke et al. |
| 2012/0052693 A1 | 3/2012 | Ozaki et al. |
| 2013/0171822 A1 | 7/2013 | Chandrashekar et al. |
| 2014/0213037 A1 | 7/2014 | LiCausi et al. |
| 2015/0099374 A1 | 4/2015 | Kakimoto et al. |
| 2015/0217330 A1 | 8/2015 | Haukka et al. |
| 2017/0140920 A1 | 5/2017 | Amepalli et al. |
| 2017/0140931 A1 | 5/2017 | Van Cleemput et al. |
| 2018/0237912 A1* | 8/2018 | Takahashi ............ H01J 37/321 |
| 2019/0051511 A1 | 2/2019 | Kato et al. |
| 2019/0051512 A1* | 2/2019 | Kato ................ H01L 21/02211 |

* cited by examiner

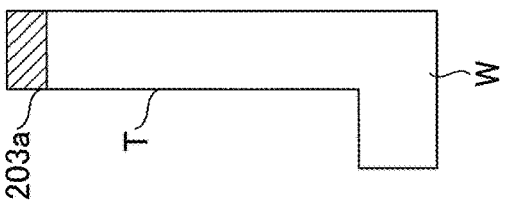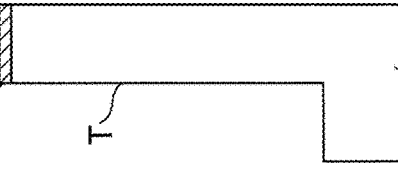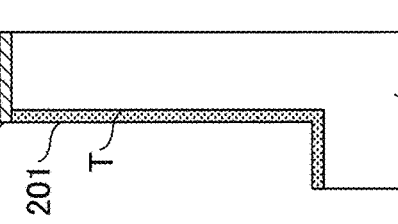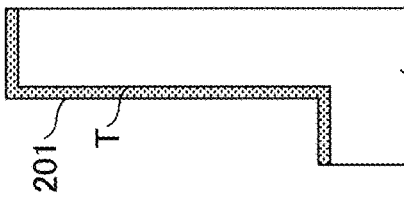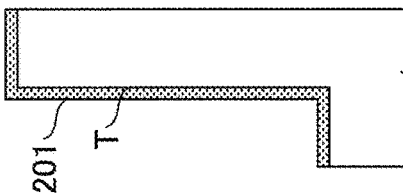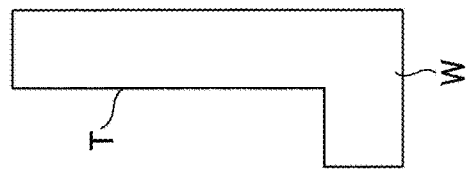

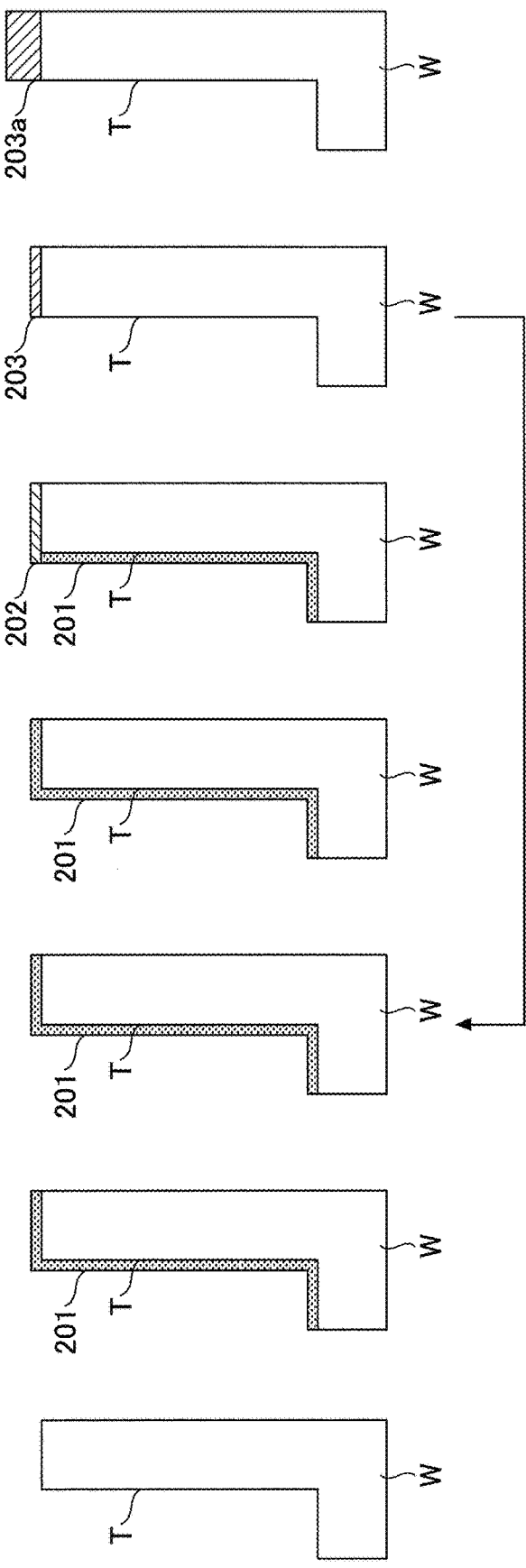

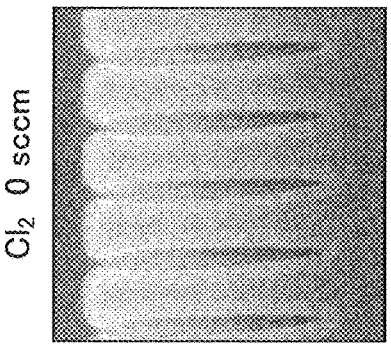
FIG. 14D Cl₂ 75 sccm
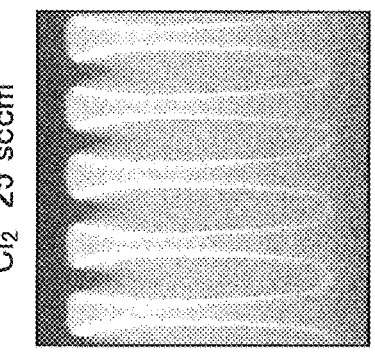
FIG. 14C Cl₂ 50 sccm
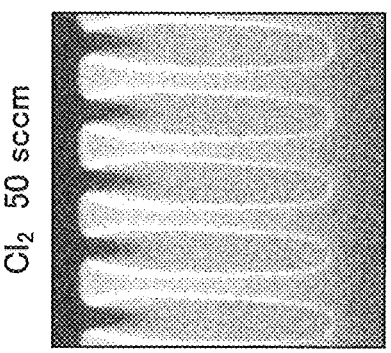
FIG. 14B Cl₂ 25 sccm
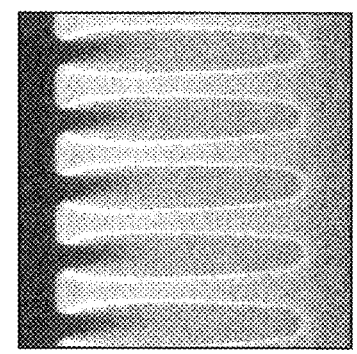
FIG. 14A Cl₂ 0 sccm

FILM DEPOSITION METHOD OF DEPOSITING FILM AND FILM DEPOSITION APPARATUS

CROSS-REFERENCE TO RELATED APPLICATIONS

The present application claims priority under 35 U.S.C. § 119 to Japanese Patent Application No. 2017-232878 filed Dec. 4, 2017. The contents of which are incorporated herein by reference in their entirety.

BACKGROUND OF THE INVENTION

Field of the Invention

The present invention relates to a film deposition method of depositing a film and a film deposition apparatus.

Description of the Related Art

There is a method of forming a nitride film in minute recesses by repeating an adsorbing step and a nitriding step, the adsorbing step causing a substrate to be processed, on the surface of which minute recesses are formed, to adsorb a film deposition raw gas containing an element making the nitride film to be subjected to film deposition and chlorine, and a nitriding step nitriding the adsorbed film deposition raw gas using activated species, wherein the nitriding step generating NH* activated species and N* activated species as the activated species, and controlling the densities of the NH* activated species and the N*activated species so as to change an adsorbing area through which the film deposition raw gas adsorb into the minute recesses (for example, see Patent Document 1).

In this method of forming the nitride film, before the film deposition, the nitriding step is performed mainly using the NH* activated species as an initial film deposition stage of forming a conformal nitride film, and then the nitriding step is performed so that the density of the N* activated species is continuously decreased from a state where the density of the N* activated species is high to cause the nitride film to grow from the bottom portion of the minute recesses as a film deposition stage. With this, the nitride film is subjected to bottom-up growth from the bottom portion of trench, and then conformal growth is controlled to obtain while the density of the NH* activated species is high so that the nitride film can be embedded without forming void or seam inside the minute trench.

[Patent Document 1] Japanese Unexamined Patent Application Publication 2017-92098

SUMMARY OF THE INVENTION

A film deposition method for depositing a silicon nitride film of selectively depositing on a flat surface of a substrate between minute recesses including a chlorine radical adsorbing step of supplying a chlorine containing gas that is activated onto a front surface of the substrate to cause the chlorine radical to be adsorbed entirely on the front surface of the substrate, a nitriding step of supplying a nitriding gas that is activated onto the substrate on which the chlorine radical adsorbs, causing the chlorine radical adsorbing on the flat surface, and nitride the flat surface from among the front surface of the substrate so as to form a silicon adsorption site, and a raw gas adsorbing step of supplying a raw gas that contains silicon and chlorine onto the substrate so as to cause the raw gas to adsorb onto the silicon adsorption site.

BRIEF DESCRIPTION OF THE DRAWINGS

FIGS. 12A-12F illustrate an example of a series of processes of a film deposition method according to the embodiment of the present invention;

FIGS. 13A-13G illustrate another example of the series of processes of the film deposition method according to the embodiment of the present invention;

FIGS. 14A-14D illustrate SEM images indicating experimental results of the film deposition method according to the first embodiment of the present invention;

DESCRIPTION OF THE EMBODIMENTS

However, except for a bottom-up film deposition described in Patent Document 1, there is a case where a silicon nitride film is selectively required to be formed on a flat surface between multiple minute recesses on a substrate, on which the multiple minute recesses are formed. Such a silicon nitride film satisfying this request is expected.

Therefore, the object of the present invention is to provide a film deposition method for depositing a silicon nitride film enabling to selectively form the flat surface between multiple minute recesses on the substrate, on which the multiple minute recesses are formed, and a film deposition apparatus pertinent thereto.

Reference symbols typically designate as follows.
T: vacuum chamber;
2: turntable;
4: fan-like portion;
5: ring-shaped protruding portion;
7: heater unit;
11: ceiling plate;
12: chamber body;
15: transfer opening;
24: recessed portion;
31 to 33: reaction gas nozzle;
41, 42: separation gas nozzle;
80, 90: plasma generator;
91: plasma producing unit;
93: shower head unit;
130 to 132: gas supply source;
P1 to P3: processing area; and
W: wafer.

Hereinafter, referring to the figures, embodiment of the present invention is described. For example, the embodiment is about a film deposition apparatus of depositing a silicon nitride film enabling to selectively form the flat surface between multiple minute recesses on a wafer W, on which the multiple minute recesses are formed, and a film deposition method pertinent thereto.

[Film Deposition Apparatus]

Figure 1:
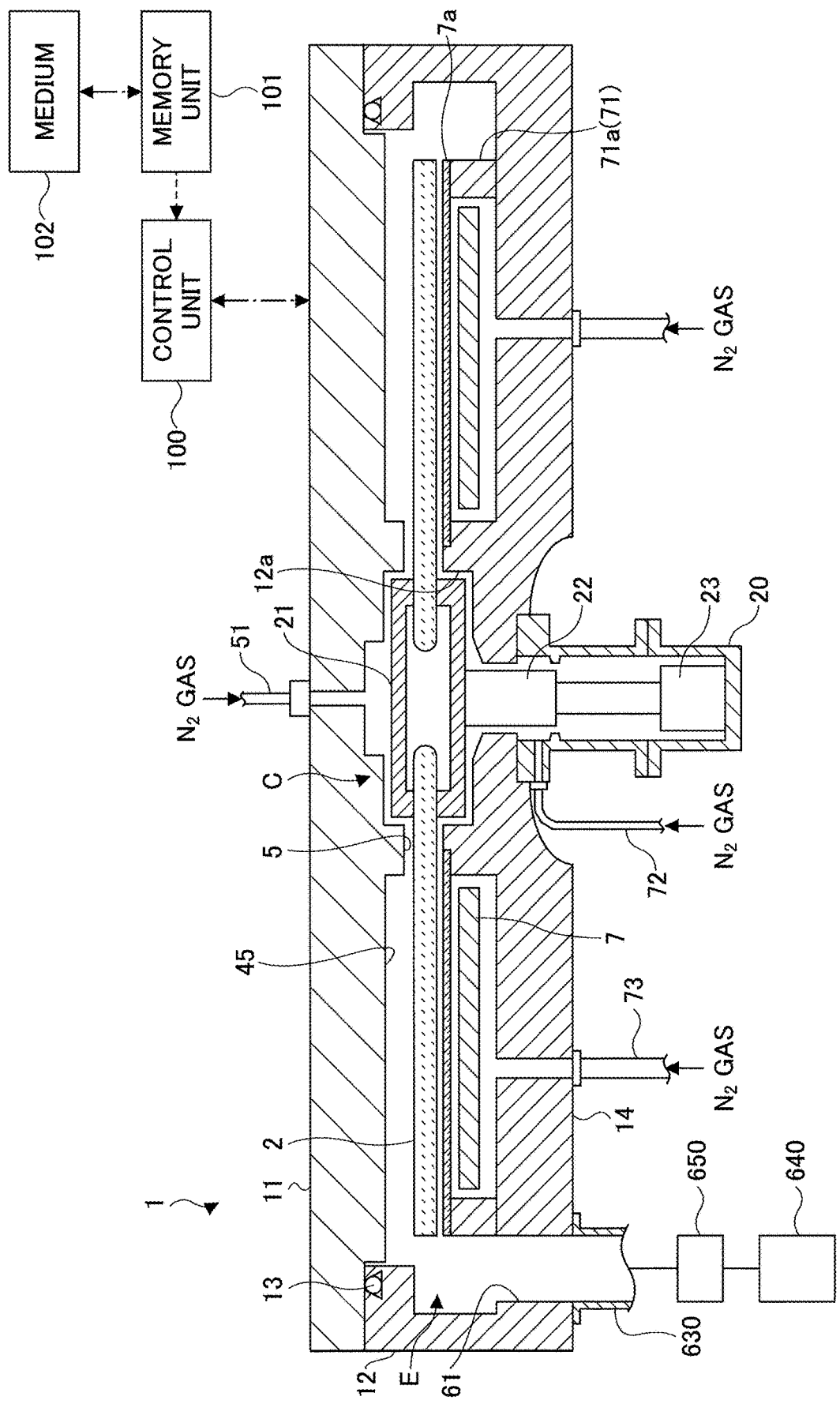
FIG. 1 is a cross-sectional view schematically illustrating an example of the film deposition apparatus of an embodiment.
Figure 2:
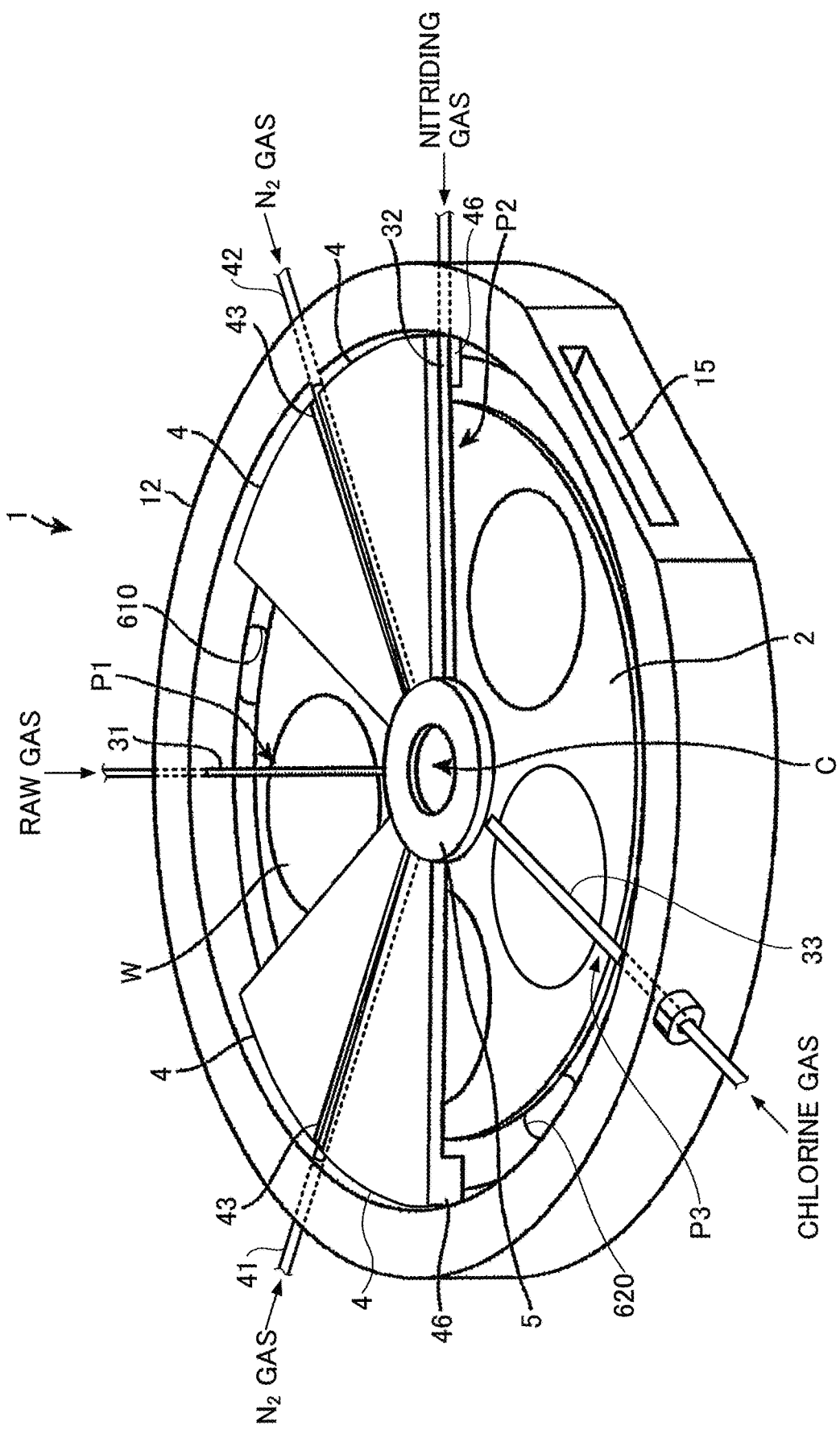
FIG. 2 is a perspective view schematically illustrating a structure inside a vacuum chamber of the film deposition apparatus of the embodiment of the present invention.
Figure 3:
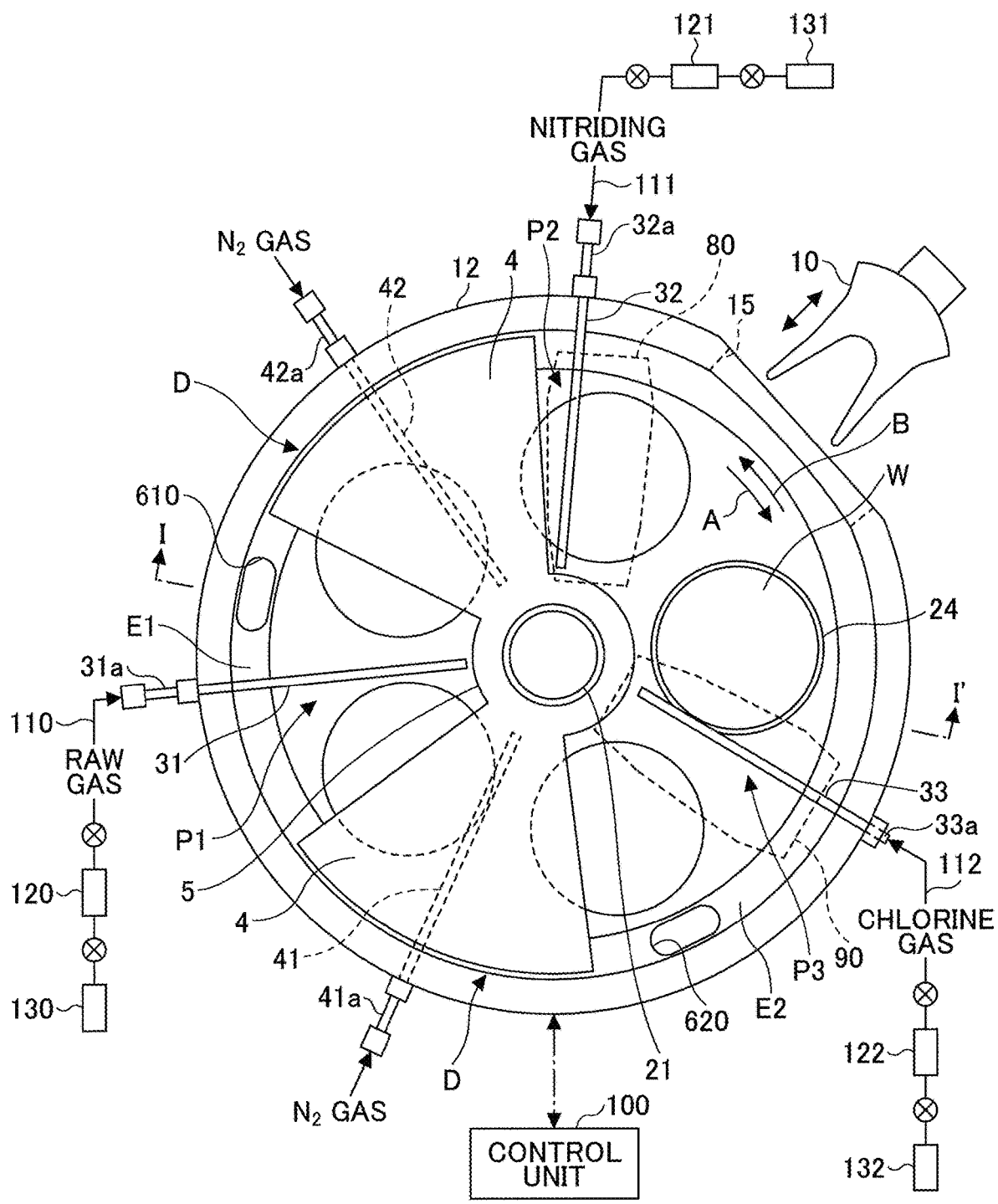
FIG. 3 is a plan view schematically illustrating a structure inside the vacuum chamber of the film deposition apparatus of the embodiment of the present invention.

At first, the film deposition apparatus of the embodiment is described. Referring to FIGS. 1 to 3, the film deposition apparatus of the embodiment includes a vacuum chamber 1 having a substantially circular shape in its plan view and a flattened shape in its side view, and a turntable 2 having its rotational center in the center of the vacuum chamber 1. The vacuum chamber 1 is a treatment chamber for depositing a film on the upper surface of a wafer which is accommodated inside the vacuum chamber 1. The vacuum chamber 1 includes a chamber body 12 having a bottomed cylindrical shape, and a ceiling plate 11, which is attachably and detachably provided onto the upper surface of the chamber body 12 through a sealing member 13 (see FIG. 1) such as an O-ring to hermetically seal the vacuum chamber 1.

The turntable 2 is fixed by a core portion 21 in a cylindrical shape at the center portion of the turntable 2. The core portion 21 is fixed to the upper end of a rotary shaft 22 extending in the vertical direction. The rotary shaft 22 penetrates through a bottom portion 14 of the vacuum chamber 1. The lower end of the rotary shaft 22 is attached to a driving mechanism 23, which causes the rotary shaft 22 (see FIG. 1) to rotate around the vertical axis of the rotary shaft 22. The rotary shaft 22 and a driving unit 23 are accommodated in a cylindrical case body 20 whose upper surface is opened. A flange on the upper surface of the case body 20 is hermetically attached to the lower surface of the bottom portion 14 of the vacuum chamber 1 to maintain a gastight state between the inner atmosphere and the outer atmosphere of the case body 20.

Referring to FIGS. 2 and 3, circular recessed portions 24 for receiving multiple semiconductor wafers (5 wafers are illustrated in FIGS. 2 and 3) are provided on the front surface of the turntable 2 along a rotational direction (a peripheral direction) of the turntable 2. FIG. 3 illustrates a state where the wafer W is mounted in only one recessed portion 24 for convenience. The inner diameter of the recessed portion 24 is slightly greater than the diameter of the wafer W by, for example, 4 mm. The depth of the recessed portion 24 is substantially equal to the thickness of the wafer W. Therefore, when the wafer W is accommodated in the recessed portion 24, the height of the surface of the wafer W is substantially the same as the height of the surface of the turntable 2 in an area where the wafer is not mounted. For example, through holes (not illustrated), through which up-and-down pins for moving up and down the back surface of the wafer W by supporting the back surface, penetrate the bottom surface of the recessed portion 24. For example, the number of the up-and-down pins is three.

FIGS. 2 and 3 illustrate the structure inside the vacuum chamber 1. For convenience, the ceiling plate 11 is omitted from illustration in FIGS. 2 and 3. As illustrated in FIGS. 2 and 3, a reaction gas nozzle 31, a reaction gas nozzle 32, and separation gas nozzles 41, 42, which are made of, for example, quartz, are arranged above the turntable 2 while mutually interposing gaps in a peripheral direction of the vacuum chamber 1 (the rotational direction along an arrow B in FIG. 3 of the turntable 2). In the film deposition apparatus of the embodiment, the rotational direction of the turntable 2 can be the direction of the arrow A (the clockwise direction), here the rotational direction of the turntable 2 is the direction of the arrow B (the counterclockwise direction). In FIGS. 2 and 3, the reaction gas nozzle 32, the separation gas nozzle 42, the reaction gas nozzle 31, the separation gas nozzle 42, and the separation gas nozzle 41 are arranged in this order in the counterclockwise direction (the rotational direction of the turntable 2) from a transfer opening 15 described below. These nozzles 31, 32, 33, 41, and 42 are attached to the chamber body 12 by fixing gas introducing ports 31a, 32a, 33a, 41a, and 42a (see FIG. 3), which are base portions of the nozzles 31, 32, 33, 41, and 42, respectively, to the outer peripheral wall of the vacuum chamber 1 so as to horizontally extend along radii of the chamber body 12. Thus, these nozzles 31, 32, 33, 41, and 42 are introduced inside the vacuum chamber 1 from the outer peripheral wall of the vacuum chamber 1.

As illustrated in FIG. 3, the reaction gas nozzle 31 is connected to the gas supply source 130, which is the gas supply source 130 of the raw gas being a silicon containing gas containing silicon and chlorine, through a pipe arrangement 110, a flow rate controller 120 and so on. The separation gas nozzles 41 and 42 are connected to a gas supply source (not illustrated) for supplying a separation gas, through a pipe arrangement, a flow rate control valve and so on (not illustrated). The separation gas may be an inert gas such as a rare gas of helium (He), Argon (Ar) or the like or a nitrogen ($N_2$) gas. Within this embodiment, an example of using a $N_2$ gas is described.

Multiple gas injection holes 35 opening toward the turntable 2 are arranged in the reaction gas nozzles 31, 32, and 33 along the longitudinal directions of the reaction gas nozzles 31, 32, and 33 at an interval of, for example, 10 mm. The lower area of the reaction gas nozzle 31 is a first processing area P1 that causes the wafer W to adsorb the raw gas. The lower area of the reaction gas nozzle 32 is a second processing area P2 in which an activated nitriding gas is supplied to the wafer W to nitride the surface of the wafer W. The lower area of the reaction gas nozzle 33 is a third processing area P3, to which an activated gas containing chlorine is supplied to cause the entire front surface of the wafer W to adsorb chlorine radical. Within the embodiment, a chlorine radical is caused to adsorb on the entire front surface of the wafer W in the third processing area P3. The front surface, on which the chlorine radical adsorbs, becomes an adsorption blocking area where the adsorption of the raw gas is blocked. In the second processing area P2, the activated nitriding gas is supplied to the wafer W, the entire front surface of which is adsorbed by the chlorine radical in the third processing area P3. Here, the chlorine radical adsorbing on the flat surface of the wafer W is caused to desorb and the front surface on the flat surface of the wafer W is nitrided so as to form a silicon adsorption site. When the chlorine radical is caused to desorb, silicon, which is derived from the raw gas adsorbing on the flat surface of the wafer W and is not nitride yet, is exposed on the front surface of the wafer W, and the exposed silicon is nitrided to produce a molecular layer made with the nitride. The molecular layer made with the nitride forms a nitride film to be deposited. However, the supply of the nitriding gas in the second processing area P2 is also performed in an initial stage when the wafer W is mounted on the turntable 2 and a raw gas is not supplied yet to the wafer W. In this initial stage, the surface of the wafer W is nitrided. The raw gas is supplied in the first processing area P1 to the wafer W, the flat surface on which the silicon adsorption site is formed in the above second processing area P2, so as to cause the silicon adsorption site on the flat surface of the wafer W to adsorb the raw gas. The raw gas is supplied in the first processing area P1 to the wafer W, the flat surface on which the silicon adsorption site is formed in the above second processing area P2, so as to cause the silicon adsorption site on the flat surface of the wafer W to adsorb the raw gas. Here, because the first processing area P1 is an area in which the raw gas is supplied, the first processing area P1 may be referred to as a raw gas supplying area P1. Similarly, because the second processing area P2 is an area in which the nitriding gas, which enables to produce the nitride by reacting with the raw gas, is supplied, the second processing area P2 may be referred to as a nitriding gas supplying area P2. Further, because the third processing area P3 is an area in which the chlorine radical is supplied, the third processing area P3 may be referred to as a chlorine radical supplying area P3.

Meanwhile, on a part on the wafer W other than the flat surface, namely, on front surfaces inside the minute recesses formed on the wafer W, the chlorine radical adsorbs on front surfaces inside the minute recesses formed on the wafer W. However, even if the nitriding gas activated in the second processing area P2 is supplied, the chlorine radical does not desorb. Therefore, the silicon adsorption site is not formed at the part of the wafer W other than the flat surface of the wafer W. Therefore, if the raw gas is supplied in the first processing area P1, the raw gas does not adsorb on the front surfaces inside the minute recesses. Accordingly, the silicon nitride film is not deposited on the front surfaces inside the minute recesses. The reason why the raw gas does not adsorb on the front surfaces inside the minute recesses and therefore the silicon nitride film is not deposited is described later.

A plasma generator 90 is provided in the vicinity of the third processing area P3, for example, above or beside the third processing area P3. A plasma generator 80 is provided above the second processing area P2. Referring FIG. 3, the plasma generators 80 and 90 are indicated by dashed lines. The plasma generator 90 is a remote plasma generator for generating chlorine radical. Meanwhile, the type of the plasma generator 80 may be any. For example, the type of the plasma generator 80 may be Inductively Coupled Plasma (ICP). The plasma generators 80 and 90 are described in detail later.

The raw gas may be a gas containing silicon and chlorine. For example, in a case where a silicon nitride (SiN) film is deposited, a gas containing silicon and chlorine such as dichlorosilane (DCS, $SiH_2Cl_2$) may be selected. The raw gas may be various gases as long as silicon and chlorine are contained. DCS is an example of such a gas containing silicon and chlorine. Other than DCS, for example, tetrachloroshilane (TCS, $SiCl_4$), hexachlorodisilane (HCD, $Si_2Cl_6$), and so on may be preferably used.

Ordinarily, an ammonia ($NH_3$) containing gas may be selected as the nitriding gas. A nitrogen ($N_2$) containing gas may be selected as the nitriding gas when the nitriding gas is activated by plasma and then is supplied. The nitriding gas may contain a carrier gas such as Ay besides ammonia.

Chlorine radical supplied from the reaction gas nozzle 33 plays a roll of forming an adsorption blocking area, which blocks the raw gas supplied by the reaction gas nozzle 31 from adsorbing on the wafer W, on the front surface of the wafer W. In the film deposition apparatus and the film deposition method of the embodiment, the adsorption blocking area is formed on the entire front surface of the wafer W to selectively desorb the chlorine radical adsorbing onto the flat surface of the wafer W to make the flat surface the silicon adsorption site. Thus, the raw gas is controlled to selectively adsorb on the flat surface of the wafer W. The film deposition method of the embodiment will be described later in detail. Referring to FIGS. 2 and 3, the reaction gas nozzle 33 extends in the horizontal direction. This reaction gas nozzle 33 may be structured to function as a shower head. Referring to FIGS. 2 and 3, described here is a case where the reaction gas nozzle 33 is a nozzle that extends in the horizontal direction. A case where the reaction gas nozzle 33 is structured to function as the shower head is described.

Referring to FIGS. 2 and 3, two fan-like portions 4 are provided inside the vacuum chamber 1. The fan-like portions 4 are attached to the back surface of the ceiling plate 11 so as to protrude toward the turntable 2 as described below. Thus, the fan-like portions 4 and the separation gas nozzles 41, 42 form the separating areas D. Each fan-like portion 4 has a substantially sector form in its plan view with its apex cut in a circular arc shape. Within this embodiment, an inner circular arc is connected to a ring-shaped protruding portion 5 (described later), and an outer circular arc is arranged along an inner peripheral surface of the chamber body 12 of the vacuum chamber 1.

Figure 4:
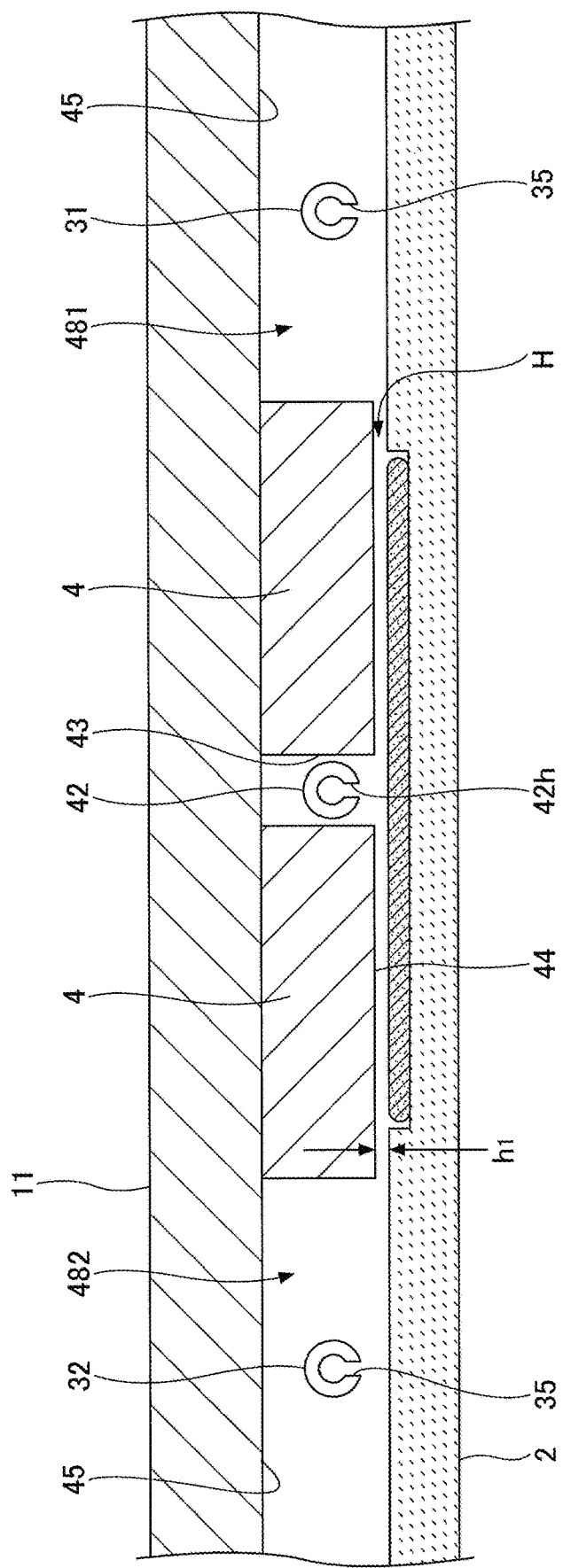
FIG. 4 is a cross-sectional view schematically illustrating the vacuum chamber along a concentric circle of a turntable of the film deposition apparatus.

FIG. 4 is a cross-sectional view of the vacuum chamber 1 along a concentric circle of the turntable 2 from the reaction gas nozzle 31 to the reaction gas nozzle 32. As illustrated, a fan-like portion 4 is attached onto the back surface of the ceiling plate 11. There are a lower ceiling surface (a first ceiling surface), which is a lower surface of the fan-like portion 4, and a higher ceiling surface 45 (a second ceiling surface), which is a higher surface of the fan-like portion 4 and is positioned on both sides of the lower ceiling surface 44 in a peripheral direction. The lower ceiling surface 44 is shaped like a sector having its apex cut so as to form like a circular arc in its plan view. Further, as illustrated in FIG. 4, a groove 43 is formed in a center of the fan-like portion 4 in its peripheral direction so as to extend in a radius direction. The separation gas nozzle 42 is accommodated inside the groove 43. Another groove 43 is similarly formed in another fan-like portion 4. The separation gas nozzle 41 is accommodated in the other groove 43. The reaction gas nozzles 31 and 32 are provided in spaces lower than the higher ceiling surface 45. The reaction gas nozzles 31 and 32 are provided in the vicinity of the wafer W and apart from the higher ceiling surface 45. Referring to FIG. 4, the reaction gas nozzle 31 is provided in a space 481 below the higher ceiling surface 45 on the right side, and the reaction gas nozzle 32 is provided in a space 482 below the higher ceiling surface 45 on the left side.

Multiple gas injection holes 42h (see FIG. 4) opening toward the turntable 2 are provided in the separation gas nozzles 41 and 42 which are accommodated in the grooves 43 of the fan-like portions 4. The gas injection holes 42h are aligned along the longitudinal directions of the separation gas nozzles 41 and 42 at an interval of, for example, 10 mm.

A separation space H, which is narrow, is formed between the lower ceiling surface 44 and the turntable 2. When the $N_2$ gas is supplied from the gas injection holes 42h of the separation gas nozzle 42, the $N_2$ gas flows toward the spaces 481 and 482 through the separation space H. At this time, the volume of the separation space H is smaller than the volume of the spaces 481 and 482. Therefore, the pressure of the separation space H is relatively higher than the pressure in the spaces 481 and 482. Said differently, the separation space H having a high pressure is formed between the spaces 481 and 482. Further, the $N_2$ gas flowing into the spaces 481 and 482 from the separation space H functions as a counter flow against the first reaction gas from the first process area P1 and a counter flow against the second reaction gas from the second process area P2. Therefore, the first reaction gas from the first process area P1 and the second reaction gas from the second process area P2 are separated by the separation space H. Therefore, it is possible to prevent the first reaction gas and the second reaction gas from mixing inside the vacuum chamber 1 to cause a reaction.

It is preferable to set the height h1 of the lower ceiling surface 44 relative to the upper surface of the turntable 2 suitable for increasing the pressure in the separation space H to be higher than the pressures in the spaces 481 and 482 in consideration of the pressure inside the vacuum chamber 1 at the time of depositing the film, the rotational speed of the turntable 2, the supply amount of the separation gas (the $N_2$ gas), or the like.

As illustrated in FIGS. 2 and 3, a ring-shaped protruding portion 5 surrounding the outer periphery of the core portion 21, to which the turntable 2 is fixed, is provided under the lower surface of the ceiling plate 11. In this embodiment, the ring-shaped protruding portion 5 is continuous from a portion of the fan-like portion 4 on a side of the rotation center. The height of the lower surface of the ring-shaped protruding portion 5 is the same height as the height of the lower ceiling surface 44.

Figure 5:
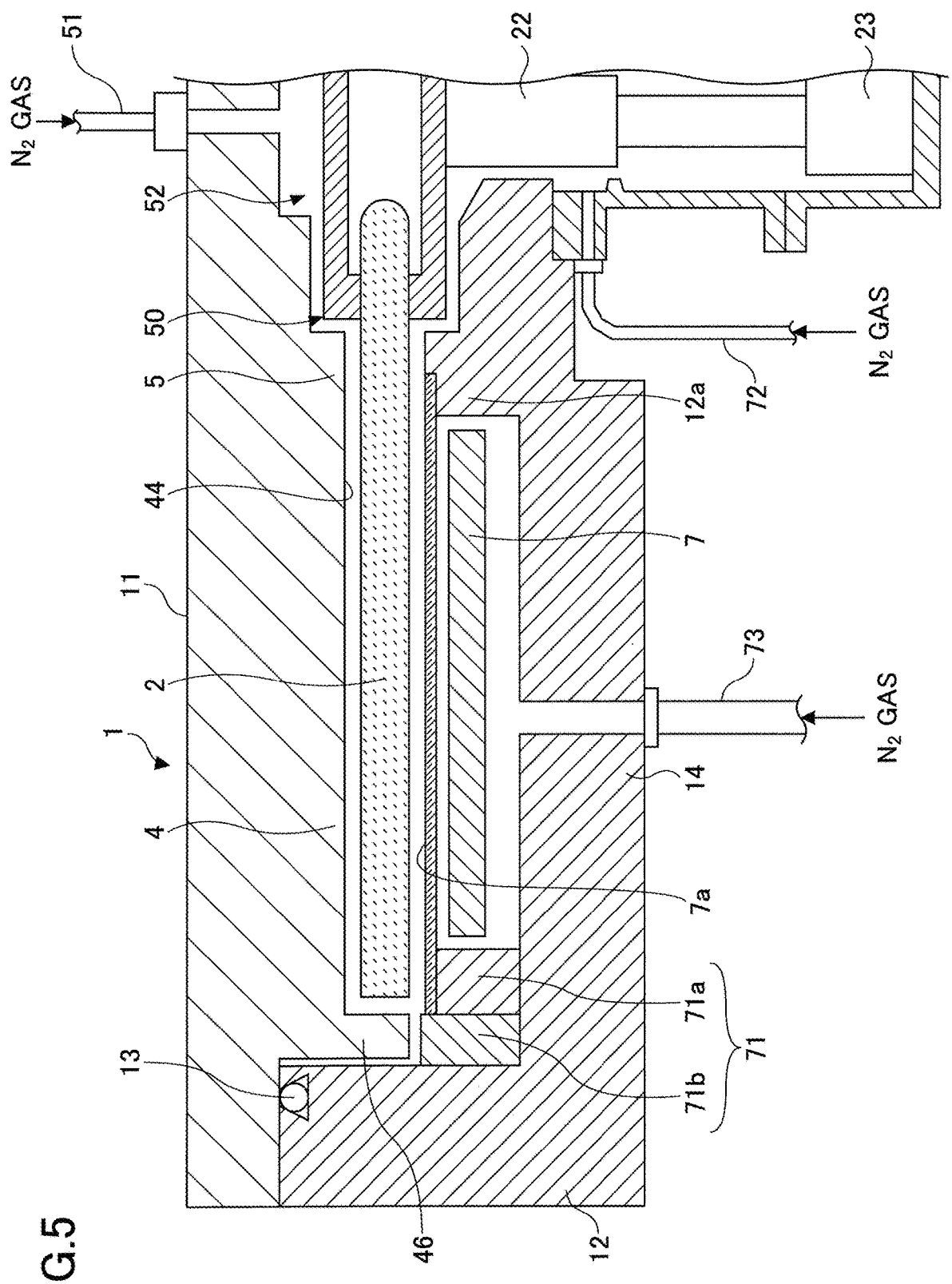
FIG. 5 is a cross-sectional view schematically illustrating another film deposition apparatus of the embodiment.

FIG. 1 is a cross-sectional view taken along a line I-I' of FIG. 3. FIG. 1 illustrates an area where the higher ceiling surface 45 is provided. Meanwhile, FIG. 5 is a cross-sectional view of an area including the lower ceiling surface 44. As illustrated in FIG. 5, a peripheral edge portion (a portion of the vacuum chamber 1 on the outer edge side) of the fan-like portion 4 in a substantially sector form has a bent portion 46 bent in a L-like shape so as to face the outer end surface of the turntable 2. The bent portion 46 prevents reaction gases from intruding from the both sides of the separating area D in a manner similar to the fan-like portion 4 to prevent the reaction gases from mixing. The fan-like portion 4 in the substantially sector form is provided in the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 may be set to have a dimension similar to, for example, that of a gap between the lower ceiling surface 44 and the upper surface of the turntable 2.

As illustrated in FIG. 4, the inner peripheral wall of the chamber body 12 has a vertical surface in the vicinity of the circumferential surface of the bent portion 46 in the separation area D. However, as illustrated in FIG. 5, the inner peripheral wall of the chamber body 12 is recessed outward in a portion other than the separation area D, for example, from a portion facing the outer edge surface of the turntable 2 toward the bottom portion 14. Referring to FIGS. 1 and 3, for convenience of explanation, this recessed portion having a substantially rectangular shape in its cross-sectional view is referred to as an exhaust area E, E1, or E2. Specifically, as illustrated in FIG. 3, the exhaust area communicating with the first processing area P1 is referred to as a first exhaust area E1 and the exhaust area communicating with the second and third processing area P2 and P3 is referred to as a second exhaust area E2. A first exhaust port 610 and a second exhaust port 620 are respectively formed in the bottom portions of the first and second exhaust areas E1 and E2, as illustrated in FIGS. 1 to 3. The first and second exhaust ports 610 and 620 may be connected to a vacuum pump 640 being an evacuating means through exhaust pipes 630 as illustrated in FIG. 1. Further, a pressure controller 650 is provided between the vacuum pump 640 and the exhaust pipe 630.

Referring to FIGS. 2 and 3, something like the separation area H is not provided between the second processing area P2 and the third processing area P3. However, referring to FIG. 3, casings separating the space on the turntable 2 are provided as plasma generators 80 and 90. By the plasma generators 80 and 90, a space between the second processing area P2 and the third processing area P3 is separated. The detailed description of this is given later.

As illustrated in FIGS. 1 and 5, a heater unit 7 being a heating means is provided in a space between the turntable 2 and the bottom portion 14 of the vacuum chamber 1. The wafer W on the turntable 2 is heated through the turntable 2 to have a temperature determined in a process recipe (for example, 400° C.). Referring to FIG. 5, in the vicinity of the circumference on the lower side of the turntable 2, a cover member 71 shaped like a ring is provided to prevent the gas from intruding into a lower area lower than the turntable 2 by separating an ambient atmosphere between an upper space upper than the turntable 2 and the first and second exhaust areas E1 and E2 from an atmosphere where the heater unit 7 is installed. The cover member 71 includes an inner member 71a provided in a position vertically corresponding to the outer edge portion of the turntable 2 and to an outer periphery vertically overlapping the turntable 2, and an outer member 71b provided between the inner member 71a and the inner wall surface of the vacuum chamber 1. The outer member 71b is provided in the vicinity of the bent portion 46 formed on the outer edge portion of the fan-like portion 4 under the bent portion 46. The inner member 71a surrounds the entire periphery of the heater unit 7 and is positioned under the outer edge portion and a portion slightly inner than the outer edge portion of the turntable 2.

A part of the bottom portion 14 closer to the rotational center than the space where the heater unit 7 is arranged includes the ring-shaped protruding portion 12a that protrudes upward toward the lower surface of the turntable 2 so as to approach the core portion 21 provided on the lower surface of the turntable 2 and in the vicinity of the central portion of the turntable 2. A narrow space is provided between the ring-shaped protruding portion 12a and the core portion 21. A gap between the inner peripheral surface of a through hole for the rotary shaft 22 penetrating through the bottom portion 14 and the rotary shaft 22 is small. The narrow space and the small gap communicate with the inside of the case body 20. A purge gas supplying pipe 72 is provided in the case body 20 so that the $N_2$ gas being the purge gas is supplied into the narrow space to purge the narrow space. In the bottom portion 14 of the vacuum chamber 1, multiple purge gas supplying pipes 73 are provided to purge a space where the heater unit 7 is disposed under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a restricts the gas from intruding into an area where the heater unit 7 is installed by bridging the inner peripheral wall of the outer member 71b (the upper surface of the inner member 71a) and the upper end portion of the ring-shaped protruding portion 12a along the peripheral direction so as to cover the heater unit 7 and so on. The lid member 7a may be made with, for example, quartz.

A separation gas supplying pipe 51 is connected to a central portion of the ceiling plate 11 of the vacuum chamber 1. The separation gas of the $N_2$ gas is supplied to a space 52 between the ceiling plate 11 and the core portion 21. The separation gas supplied to the space 52 is ejected toward the periphery of the turntable 2 along the surface on the side of a wafer mounting area of the turntable 2 through the space 50 between the ring-shaped protruding portion 5 and the turntable 2. The space 50 is maintained to have a pressure higher than those of the spaces 481 and 482 by the separation gas. Therefore, it is possible to prevent the raw gas supplied to the first processing area P1 and the nitriding gas gas supplied to the second processing area P2 from mixing after passing through the center area C. Said differently, the space 50 (or the center area C) functions in a manner similar to the separation space H (or the separation area D).

As illustrated in FIGS. 2 and 3, the transfer opening 15 is formed in the sidewall of the vacuum chamber 1 for serving and receiving the wafer W being the substrate between a transfer arm 10 provided outside the vacuum chamber 1 and the turntable 2. The transfer opening 15 is opened and closed by a gate valve (not illustrated). Further, an up-and-down pin (not illustrated) for serving or receiving the wafer from its back surface and a lifting and lowering mechanism (not illustrated) is provided in the recessed portion 24 being the wafer mounting area of the turntable 2. The wafers W are served and received at a position corresponding to the transfer opening 15. Therefore, the up-and-down pin can penetrate the recessed portions 24 from a lower surface of the turntable 2 to bring the wafers W to the position where the wafer W is served and received with the transfer arm 10.

Figure 6:
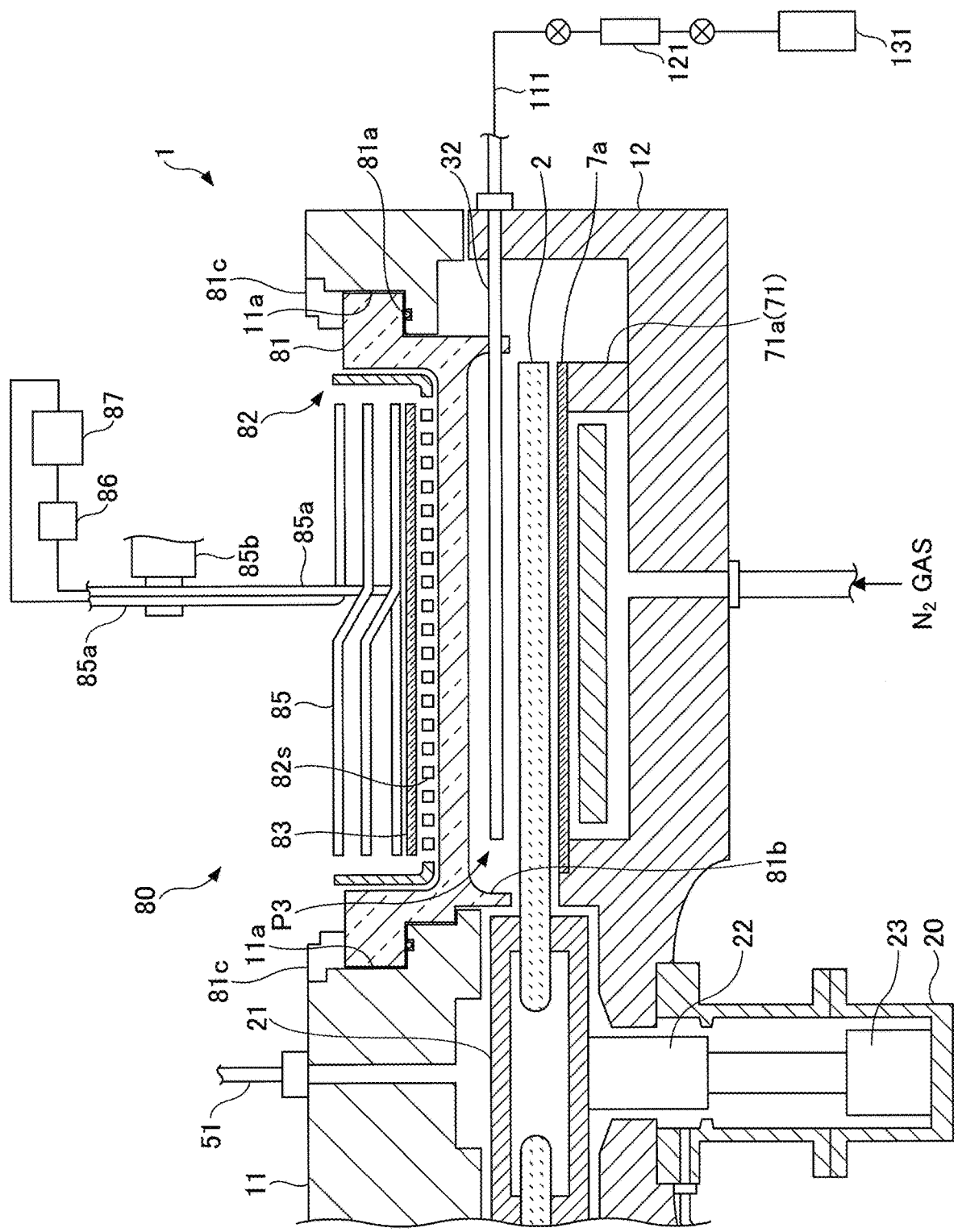
FIG. 6 is a cross-sectional view schematically illustrating an plasma generating source provided in the film deposition apparatus of the embodiment.
Figure 7:
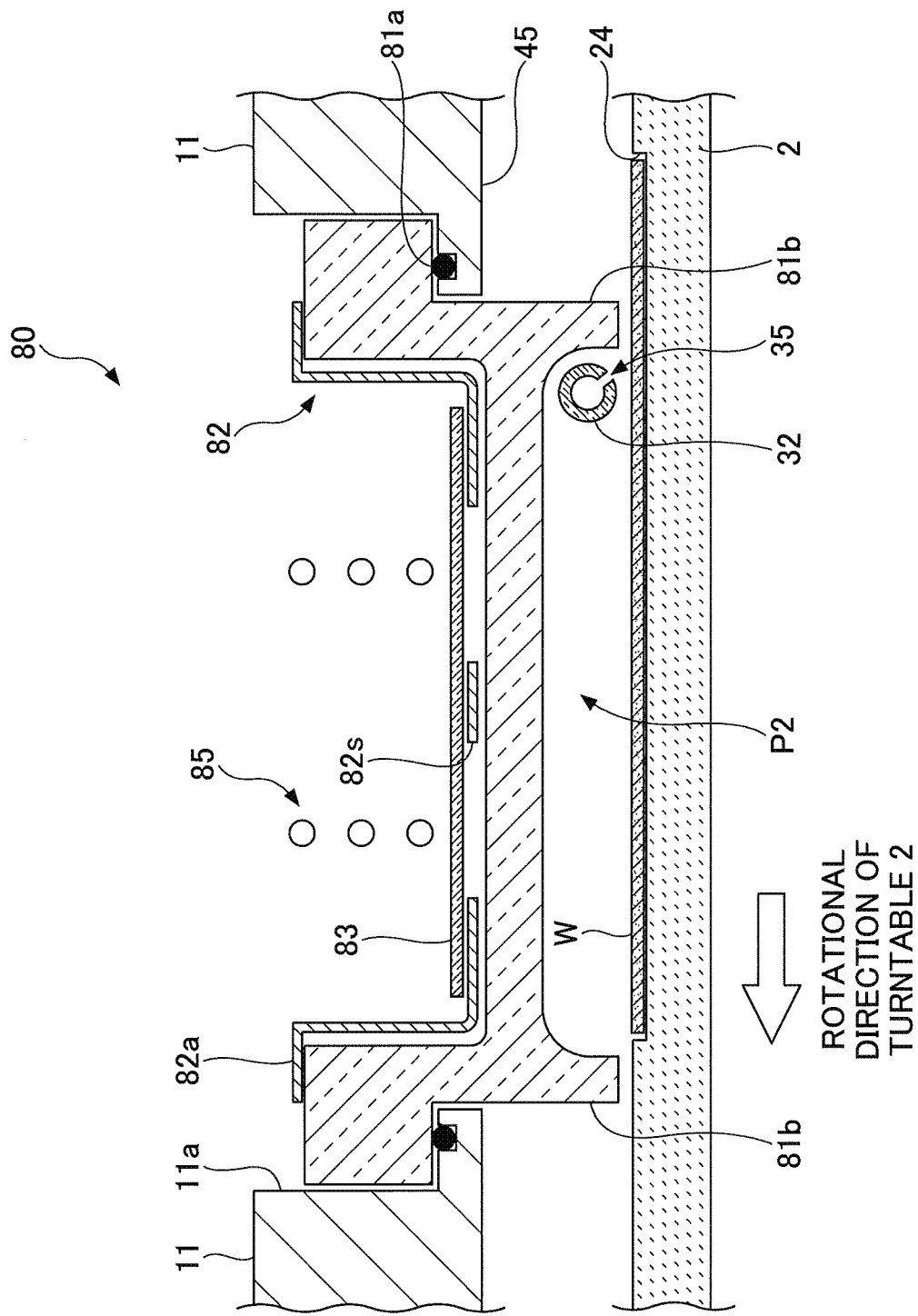
FIG. 7 is another cross-sectional view schematically illustrating the plasma generating source provided in the film deposition apparatus of the embodiment.
Figure 8:
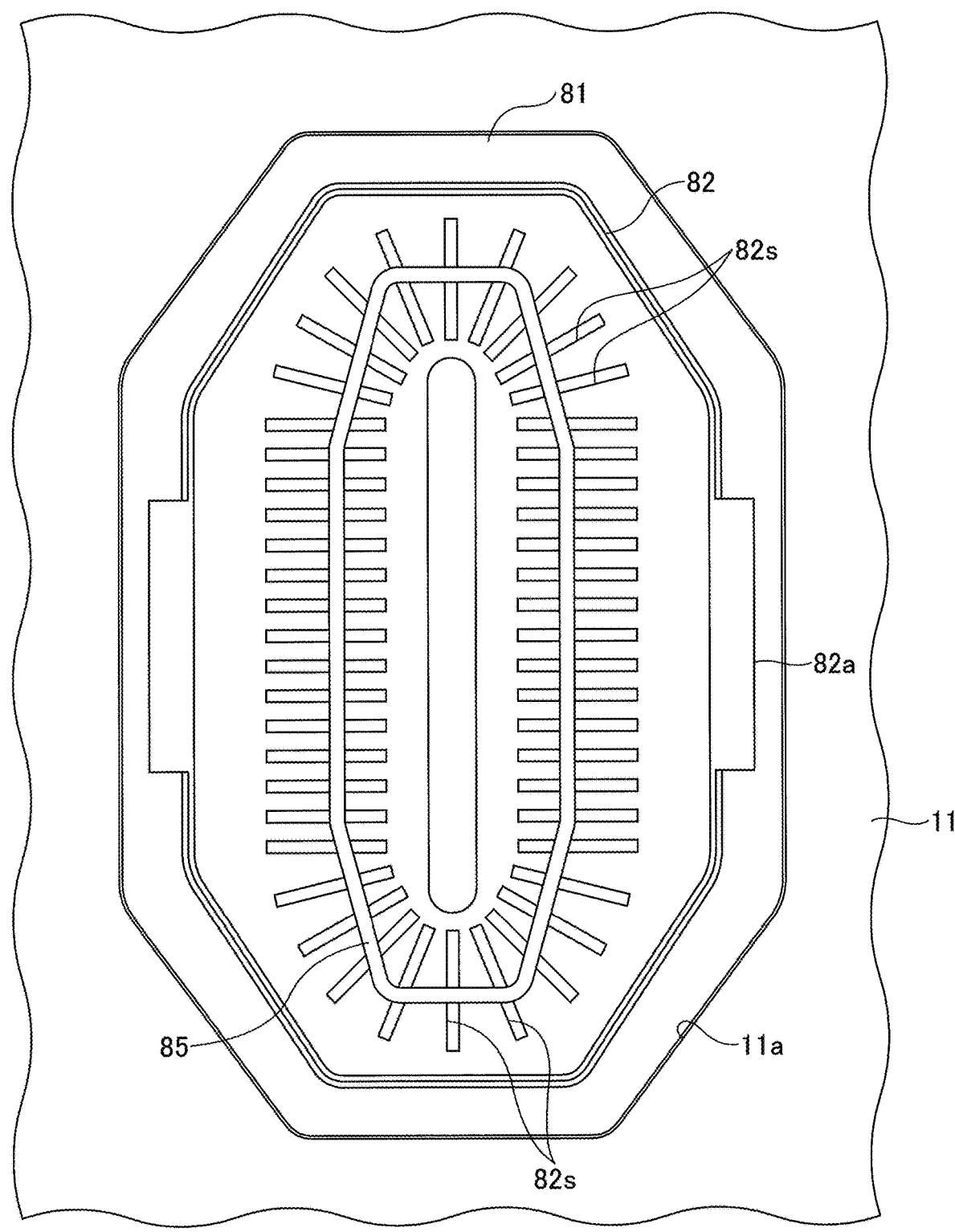
FIG. 8 is a plan view schematically illustrating the plasma generating source provided in the film deposition apparatus of the embodiment.

Referring to FIGS. 6 to 8, the plasma generator 80 is described. FIG. 6 is a cross-sectional view schematically illustrating an plasma generator 80 along a radius direction of the turntable 2. FIG. 7 is a cross-sectional view schematically illustrating the plasma generator 80 along a direction orthogonal to the radius direction of the turntable 2. FIG. 8 is a plan view schematically illustrating the plasma generator 80. For convenience, parts are partly simlplified.

Referring to FIG. 6, the plasma generator 80 includes a frame member 81 that is made with a material enabling to transmit a high-frequency wave, includes a recessed portion recessing from an upper surface, and is fit into the opening 11a formed in the ceiling plate 11, a Faraday shield 82 that is accommodated inside a recessed portion of the frame member 81 and has a shape of substantially a box having an opening at its upper portion, an insulating plate 83 that is arranged on the bottom surface of the Faraday shield 82, and an antenna 85 that is supported above the insulating plate 83 and is shaped like a coil having a substantially octagonal shape in its plan view.

The opening 11a of the ceiling plate 11 has multiple step portions. One of the step portions has a groove through its entire circumference. A sealing member 81a such as an O-ring is fit into this groove. Meanwhile, the frame member 81 has multiple step portions corresponding to the step portions of the opening 11a. When the frame member 81 is fit into the opening 11a, the back surface of the one step portion from among the multiple step portions contacts the sealing member 81a fit into the groove of the opening 11a. With this, airtightness between the ceiling plate 11 and the frame member 81 can be maintained. Referring to FIG. 6, a pressing member 81c is provided along the outer circumference of the frame member 81 fit into the opening 11a of the ceiling plate 11. With this, the frame member 81 is downward pressed toward the ceiling plate 11. Therefore, the airtightness between the ceiling plate 11 and the frame member 81 is further reliably maintained.

The lower surface of the frame member 81 faces the turntable 2 inside the vacuum chamber 1. The protruding portion 81b protrudes downward (toward the turntable 2) through the entire outer circumference of the lower surface of the turntable 2. The lower surface of the protruding portion 81b is close to the surface of the turntable 2. A space (hereinafter, referred to as a third processing area P3) is formed above the turntable 2 by being surrounded by the protruding portion 81b, the front surface of the turntable 2, and the lower surface of the frame member 81. The interval between the lower surface of the protruding portion 81b and the front surface of the turntable 2 may be substantially the same as the height h1 of the lower ceiling surface 44 relative to the front surface of the turntable 2 in the separation space H (see FIG. 4).

In the second processing area P2, the reaction gas nozzle 32 penetrating through the protruding portion 81b extends. Referring to FIG. 6, a gas supply source 131, in which a nitriding gas is filled, is connected by a pipe arrangement 111 through a flow rate controller 121 to a reaction gas nozzle 32. The nitriding gas may be, for example, a gas containing ammonia ($NH_3$), specifically a mixed gas containing ammonia ($NH_3$) and argon (Ar). The nitriding gas subjected to a flow rate control by the flow rate controller 121 is activated by the plasma generator 80. The activated nitriding gas is supplied to the second processing area P2 at a predetermined flow rate. In a case where the mixed gas of ammonia and argon is used as the nitriding gas, ammonia and argon may be separately supplied. Referring to FIG. 6, for convenience, a state that the mixed gas is supplied to the reaction gas nozzle 32 is exemplified.

Multiple gas injection holes 35 are formed along the longitudinal direction at a predetermined interval (for example, 10 mm) in the reaction gas nozzle 32. The above chlorine gas is ejected from the multiple gas injection holes 35. Referring to FIG. 7, the normal lines of the multiple gas injection holes 35 slant toward the upstream side of the rotational direction of the turntable 2 from the direction perpendicular to the front surface. Therefore, the gas supplied from the reaction gas nozzle 32 is ejected in the direction opposite to the rotational direction of the turntable, specifically, toward the gap between the lower surface of the protruding portion 81b and the front surface of the turntable 2. With this, the reaction gas and the separation gas are prevented from flowing into the second processing area P2 along the rotational direction of the turntable 2 from the space below the higher ceiling surface 45 present on the upstream side relative to the plasma generator 80. Further, as described above, because the protruding portion formed along the outer circumference of the lower surface of the frame member 81 is close to the front surface of the turntable, it is possible to easily maintain the pressure inside the second processing area P2 by the gas supplied from the reaction gas nozzle 32. With this, the reaction gas and the separation gas are prevented from flowing into the second processing area P2.

As described, the frame member 81 plays a role of separating the second processing area P2. Therefore, within the embodiment, the film deposition apparatus includes the frame member 81 that separates the second processing area P2 using the plasma generator 80.

The Faraday shield 82 is made with s conductive material such as a metal and is electrically grounded (not illustrated). Referring to FIG. 8, multiple slits 82s are formed in the bottom portion of the Faraday shield 82. Each of the multiple slits 82s extends so as to perpendicularly cross a corresponding side of the antenna having a substantially octagonal shape in its plan view.

Referring to FIGS. 7 and 8, the Faraday shield 82 includes supporting portions 82a folded outward at two upper ends. Because the supporting portions 82a are supported by the upper surface of the frame member 81, the Faraday shield 82 is supported at a predetermined position inside the frame member 81.

For example, the insulating plate 83 is made with quartz glass, has a size slightly smaller than the bottom surface of the Faraday shield, and is mounted on the lower surface of the Faraday shield 82. The insulating plate 83 insulates the Faraday shield 82 from the antenna 85 and causes the high-frequency wave emitted by the antenna 85 to transmit downward.

The antenna 85 is formed by winding three turns a hollow tube (pipe) made of copper so that the antenna 85 becomes substantially octagonal in its plan view. Cooling water is circulated inside the pipe so that the antenna is prevented from being heated to have a high temperature that is caused by the high-frequency wave supplied to the antenna. A standing portion 85a is provided in the antenna 85, and a supporting portion 85b is attached to the standing portion 85a. The antenna 85 is maintained at a predetermined position inside the Faraday shield 82 by the supporting portion 85b. A high-frequency power source 87 is connected to the supporting portion 85b through a matching box 86. The high-frequency power source 87 may generate the high-frequency wave of a frequency of, for example, 13.56 MHz.

In the plasma generator 80 structured above, when the high-frequency power is supplied from the high-frequency power source 87 through the matching box 86 to the antenna 85, the electromagnetic field is generated by the antenna 85. Since the electric field component from among the electromagnetic field is blocked by the Faraday shield 82, the electric field component cannot propagate downward. Meanwhile, the magnetic field component propagates into the third processing area P3 through the multiple slits 82s of the Faraday shield 82. The nitriding gas supplied from the reaction gas nozzle 33 to the second processing area P2 at a predetermined flow rate is activated by the magnetic field component.

Next, the plasma generator 90 of the film deposition apparatus of the this embodiment is described next.

Figure 9:
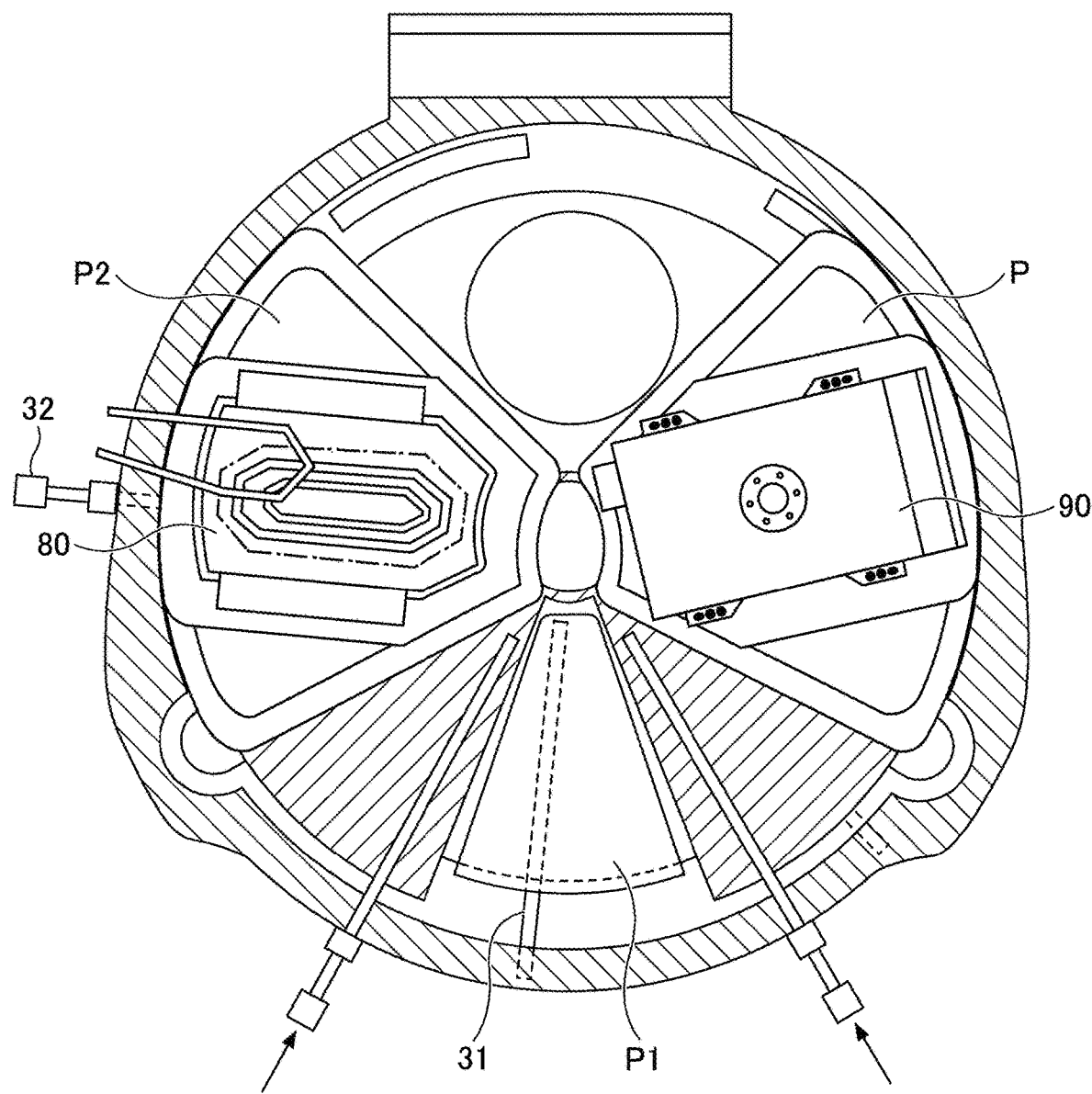
FIG. 9 is a plan view schematically illustrating an example of the film deposition apparatus of the embodiment.

FIG. 9 is a plan view of the film deposition apparatus, in which the plasma generators 80 and 90 are installed. The plasma generator 90 is structured as a plasma generator.

The plasma generator 80 of ICP plasma using the antenna 85 illustrated in FIGS. 6 to 8 is effective for generating plasma at high plasma intensity. The plasma generator 80 effectively function in a case where both an ionized nitriding gas and the nitriding gas changed to be radicals may be generated. However, in a case where the chlorine ions are unnecessary and only chlorine radicals are necessary, a remote plasma generator is more suitable. Said differently, because the remote plasma generator activates chlorine by plasma at the outside of the vacuum chamber 1, ionized chlorine having a short life is deactivated before the ionized chlorine reaches the inside of the vacuum chamber 1 or the wafer W. Only chlorine changed to be the radicals so as to have a long lifetime is supplied to the wafer W. With this, it is possible to supply the activated chlorine gas made mostly with chlorine radicals weakly activated than chlorine radicals activated by the plasma generator of ICP plasma, which directly generates plasma inside the vacuum chamber 1. The plasma generator 90 of the embodiment is a plasma generator 90 which can supply chlorine radicals without scarcely supplying the ionized chlorine too the wafer W. The remote plasma generator is an example of such a plasma generator. However, this plasma generator 90 is not limited to the remote plasma generator. Various plasma generators can be used as long as chlorine radicals are mainly generated without scarcely generating chlorine ions.

Figure 10:
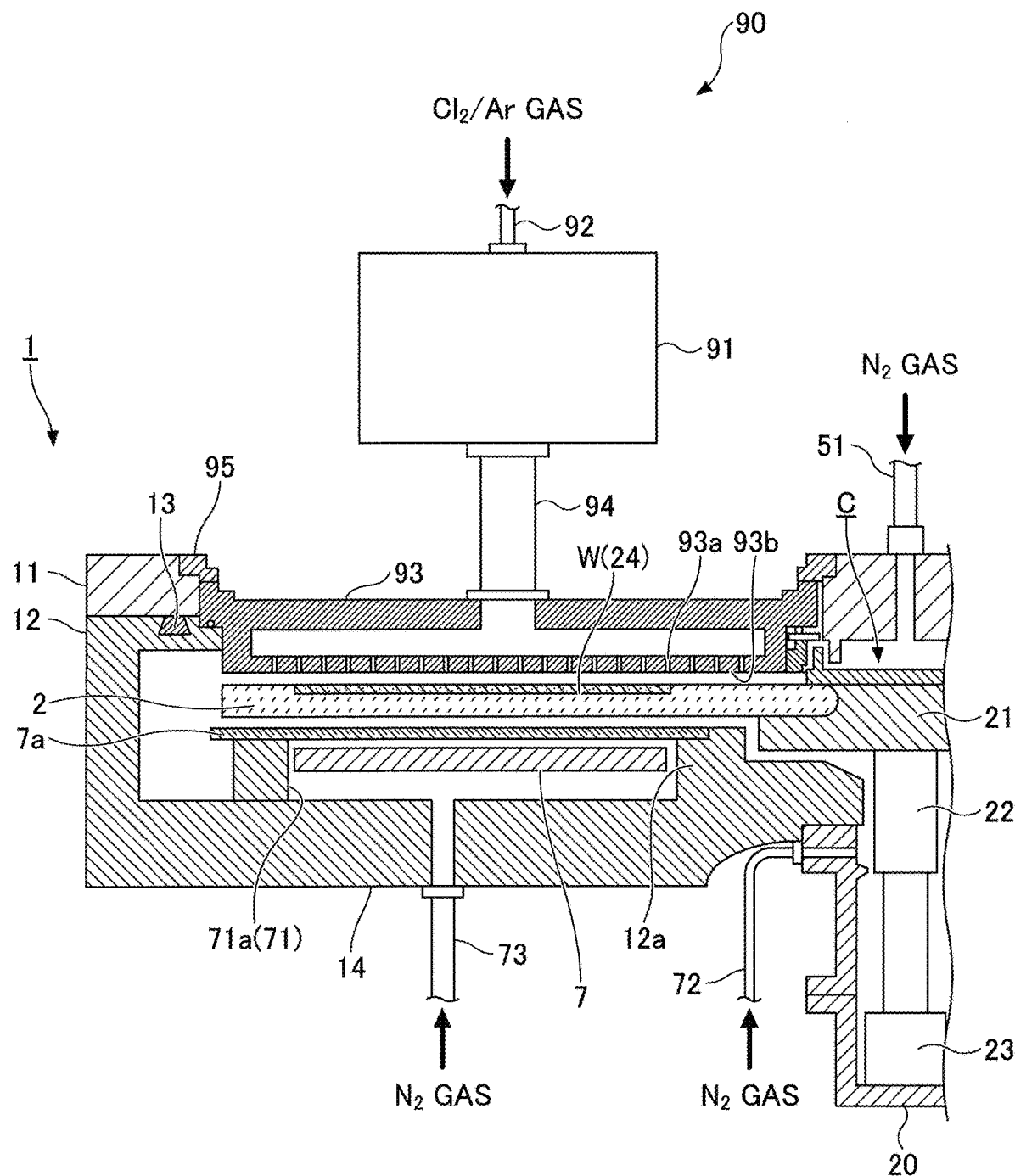
FIG. 10 is a cross-sectional view partly illustrating a third processing area P3 of the film deposition apparatus of the embodiment.

FIG. 10 is a cross-sectional view of the film deposition apparatus including the plasma generator 90 of the embodiment.

Referring to FIG. 10, the plasma generator 90 faces the turntable 2 in the third processing area P3. The plasma generator 90 includes a plasma producing unit 91, a gas supplying pipe 92, a shower head unit 93, and a pipe arrangement 94. The shower head unit 93 is an example of a chlorine gas ejecting portion. For example, a gas nozzle may be used in place of the shower head unit 9.

The plasma producing unit 91 activates the chlorine gas supplied from the gas supplying pipe 92 using a plasma source. The plasma source is not specifically limited as long as the chlorine gas can be changed to radicals. The plasma source is, for example, ICP plasma, Capacitively Coupled Plasma (CCP), and Surface Wave Plasma (SWP).

One end of the gas supplying pipe 92 is connected to the plasma producing unit 91 to supply the chlorine gas to the plasma producing unit 91. The other end of the gas supplying pipe 92 is connected to the gas supply source 132 (FIG. 3) of the chlorine gas, in which the chlorine gas is stored, through an on-off valve and a flow rate adjuster.

The shower head unit 93 is connected to the plasma producing unit 91 through the pipe arrangement 94 so as to supply chlorine containing gas activated by the plasma producing unit 91 into the vacuum chamber 1. The shower head unit 93 has a sector-like shape in its plan view and is pushed downward by a pressing member 95 formed along the outer edge of the sector-like shape in its plan view. When the pressing member 95 is fixed to the ceiling plate 11 by a bolt or the like (not illustrated), the inner atmosphere of the vacuum chamber 1 is changed to be a gastight state. When the shower head unit 93 is fixed to the ceiling plate 11, the interval between the lower surface of the shower head unit and the upper surface of the turntable 2 is, for example, about 0.5 mm to 5 mm.

The shower head unit has multiple gas injection holes 93a few on the rotational center side and many on the outer circumference side in consideration of a difference of angular speeds of the turn plate 2. The number of the multiple gas injection holes 93a is, for example, several tens to several hundreds. Further, the diameters of the multiple gas injection hole 93a are, for example, about 0.5 mm to 3 mm. The activated chlorine gas supplied to the shower head unit 93 is supplied to the space between the turntable 2 and the shower head unit 93 through the gas injection holes 93a.

Figure 11:
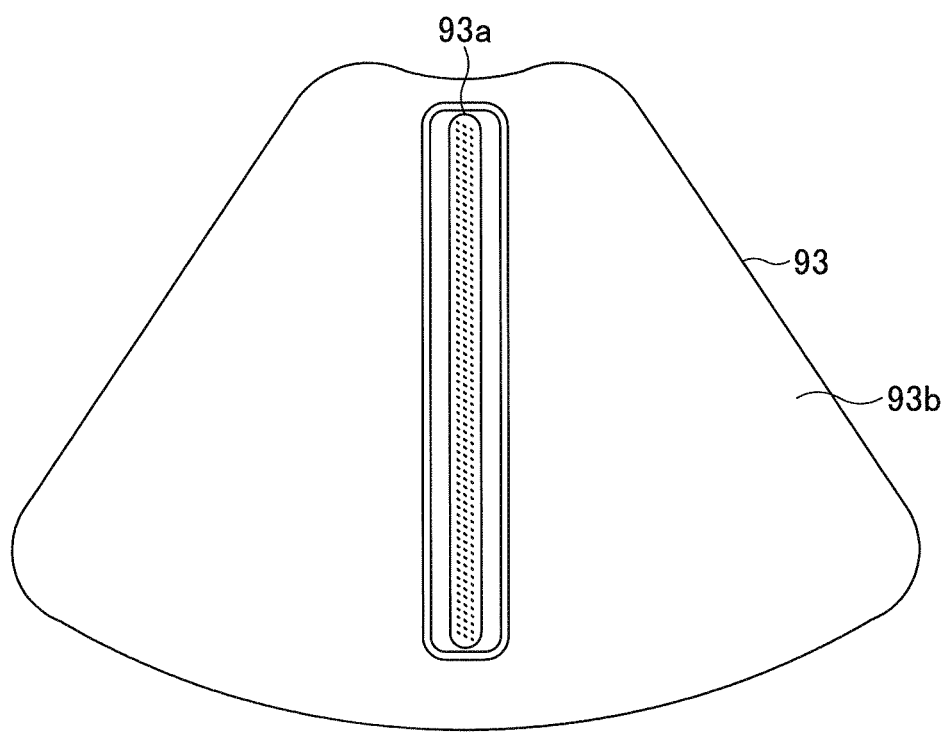
FIG. 11 is a plan view illustrating an example of the lower surface of a shower head unit.

FIG. 11 is a plan view illustrating an example of the lower surface of the shower head unit 93. Referring to FIG. 11, the gas injection holes 93a may be provided at the center in the peripheral direction of the lower surface 93b of the shower head unit 93 so as to extend along a radius direction. With this, the chlorine gas can be dispersedly supplied from the center of the turntable 2 onto the outer circumference side.

As such, the chlorine radicals may be supplied to the wafer using the plasma generator 90 structured as the remote plasma generator.

The remote plasma generator is not limited to have the structure having the shower head unit illustrated in FIGS. 9 to 11 but may have the structre of using the reaction gas nozzle 33 illustrated in FIGS. 2 and 3. In this case, for example, the plasma producing unit 91 may be provided on the outer side surface of the chamber body 12 so that the chlorine radicals are supplied from the outer side surface to the reaction gas nozzle 33.

Referring to FIG. 1, the film deposition apparatus of the embodiment includes a control unit 100 made with a computer for controlling the overall operations of the film deposition apparatus 1. A program for causing a film deposition method (see FIG. 1) described below to be implemented under a control of the control unit 100 is stored in a memory the control unit 100. This program includes groups of steps for performing the film deposition method for depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

Further, the control unit 100 performs a control for implementing the film deposition method of the embodiment described below.

[Film Deposition Method for Depositing Silicon Nitride Film]

Referring to FIGS. 12A-12F, described is a case where the film deposition method of the silicon nitride film of the embodiment is performed using the above film deposition apparatus. FIGS. 12A-12F illustrate an example of a series of processes of the film deposition method according to the embodiment of the present invention.

FIG. 12A is an example of a wafer W being a target of film deposition in a film deposition method for depositing a silicon nitride film.

Within the embodiment, the silicon wafer is used as a wafer W, a trench T being a minute recess is formed as illustrated as illustrated in FIG. 12A. Although it is not indispensable that the trench T is formed on the surface of the wafer W for the film deposition method for depositing the silicon nitride film in the embodiment, for easiness of explanation, an example that a trench T is formed on the front surface of the wafer W is exemplified. However, the film deposition method for the silicon nitride film of the embodiment is applicable to the wafer WWW on which various patterns including a flat surface are formed.

Described below is an example where dichlorosilane (DCS, $SiH_2C_{12}$) and the nitrogen gas as a carrier gas is supplied from the reaction gas nozzle 31, a mixed gas of ammonia ($NH_3$) and argon as the nitrogen gas as a carrier gas is supplied from the reaction gas nozzle 32, and a mixed gas of chlorine as a chlorine containg gas and argon is supplied from the shower head unit 93. However, because the argon gases respectively supplied together with the nitrogen gas being the carrier gas for dichlorosilane, the nitriding gas, and the chlorine gas are inert gases which do not contribte the reactions, the argon gases are not specifically described. The nitriding gas is activated (converted to plasma) by ICP plasma produced by the plasma generator 80. The chlorine containing gas is converted to radical by the remote plasma produced by the plasma generator 90.

At first, a gate valve (not illustrated) is opened in the film deposition apparatus described in FIGS. 1 to 11. The wafer W is served into the recessed portion 24 of the turntable 2 through the transfer opening 15 (see FIGS. 2 and 3) by the transfer arm 10 (see FIG. 3) provided outside the vacuum chamber 1. When the recessed portion 24 is stopped at a position facing the transfer opening 15, the up-and-down pin (not illustrated) moves up or down from the bottom portion side of the vacuum chamber 1 through the through hole in the bottom surface of the recessed portion 24 to deliver or receive the wafer W. The wafer W is served and received while the turntable 2 is intermittently rotated so as to mount the wafers W inside the recessed portions 24 equal to 5.

Subsequently, the gate valve is closed and the inside of the vacuum chamber 1 is exhausted to have an attainable degree of vacuum, to which the vacuum pump 640 can evacuate. Thereafter, the $N_2$ gas as the separation gas is discharged from the separation gas nozzles 41 and 42 at predetermined flow rates, and the $N_2$ gas is ejected from the separation gas supplying pipe 51 and the purge gas supplying pipes 72, 73 at predetermined flow rates. At this time, the pressure controller 650 (see FIG. 1) controls the inside of the vacuum chamber 1 to have a preset process pressure. Subsequently, the wafer W is heated to be, for example, 400° C. by the heater unit 7 while the turntable 2 is rotated at a rotation speed of, for example, 10 rpm in a counterclockwise direction. The rotation speed of the turntable 2 can be set to various rotation speeds depending on the intended use. Further, the plasma generators 80 and 90 are also operated.

Thereafter, as needed, the activated nitriding gas is supplied by the reaction gas nozzle 32 (FIGS. 2 and 3) to perform plasma reformulation on the front surface of the wafer W. The front surface of the wafer W including the inner surface if the trench T is subjected to reformlation by plasma nitriding. In the first plasma reformulation process, the turntable 2 is rotated at a predetermined rotational speed, stops therotation after the reformulation is finished, and temporarily stops the supply of the nitriding gas. The turntable, on which the wafer W is being mounted, continues to rotate. In a case where the plasma reformulation process is not conducted, the separation gas is supplied and the turntable 2 is rotated. Regardless of whether the plasma reformulation process is performed, the supply of the nitriding gas from the reaction gas nozzle 32 is stopped when the process illustrated in FIG. 12B is started.

Referring to FIG. 12B, an example of a first chlorine radical adsorbing step in the initial stage of the film deposition process is illustrated. In the first chlorine radical adsorbing step in the intial stage of the film deposition process, the supply of the nitriding gas in the nitriding gas supplying area P2 and the supply of the raw gas in the raw gas supplying area P1 are stopped, and the turntable 2 is rotated by at least one turn while the chlorine containing gas that is activated in the chlorine containing gas supplying area P3 is being supplied to the wafer W. Said differently, the chlorine containing gas (a chlorine gas) is supplied from the reaction gas nozzle 33, argon as the separation gas is supplied from the separation gas nozzles 41 and 42, dichlorosilane as the raw gas is not supplied from the reaction gas nozzle 31 and ammonia as the nitriding gas is not supplied from the reaction gas nozzle 32. When the chlorine containng gas (the chlorine gas) is supplied from the reaction gas nozzle 33, the chlorine radical is supplied from the shower head unit 93. In this state, the turntable 2 is rotated by at least one turn to cause the chlorine radical 1201 to be adsorbed on the surface of the wafer W including the trench T.

Because the chlorine radical 201 has an adsorption prevention effect for dichlorosilane containing chlorine, dichlorosilane is prevented from adsorption. In the chlorine radical adsorbing step, the chlorine radical having this adsorption prevention effect is adsorbed until the chlorine radical reaches the entire front surface of the wafer W including the flat surface between the trenches T of the wafer W and the bottom surface and the side surface of each trench T. The chlorine radical may not conformally adsorb onto the front surface of the wafer W. However, the adsorption of dichlorosilane is prevented on the bottom surface and the side surface of each trench T so as to form the adsorption blocking area by preventing the adsorption of dichlorosilane.

The width of this adsorption blocking area may be adjusted by adjusting the supply time of supplying chlorine radical 1201. In a case of the film deposition apparatus, by adjusting during how many turns of the turntable 2 the chlorine radical adsorbing step continues, the time for the chlorine radical adsorbing step may be adjusted. If the rotational speed of the turntable 2 that continuously performs the chlorine radical adsorbing step is set to high, the chlorine radical adsorbs almost as far as the bottom surface of the trench to form the adsorption blocking area to an wide range. If the rotational speed of the turntable 2 is set to low, adsorbs almost as far as the bottom surface of the trench to make the adsorption range narrow. It is preferable that the time for the hlorine radical adsorbing step is adjusted to have an appropriate time length in conformity with the required wideness of the adsorption blocking area. In a case where the rotation speed of the turntable 2 is 10 rpm, for example, if the chlorine radical adsorbing steps are continuously repeated three to five times, the adsorption of dichlorosilane is prevented onan area including the bottom surface and the side surface of the trench T.

Referring to FIG. 12C, an example of a second chlorine radical adsorbing step on or after the initial stage of the film deposition process is illustrated. FIG. 12D illustrates an example of a nitriding step. FIG. 12E illustrates an example of a raw gas adsorbing step. The steps illustrated in FIGS. 12C to 12E are performed by rotating the turntable by one turn while a chlorine containing gas activated in the chlorine containing gas supplying area P3 is supplied to the wafer W, the nitriding gas is supplied nitriding gas supplying area P2, and the raw gas is supplied to the raw gas supplying area P1. Said differently, the turntable 2 is rotated by one turn while the chlorine containing gas (a chlorine gas) is supplied from the reaction gas nozzle 33, dichlorosilane as the raw gas is supplied from the reaction gas nozzle 31, ammonia as the nitriding gas is supplied from the reaction gas nozzle 32, and argon as the separation gas is supplied from the separation gas nozzles 41, 42, With this, the second chlorine radical adsorbing step illustrated in FIG. 12C, the nitriding step illustrated in FIG. 12D, and the raw gas adsorbing step illustrated in FIG. 12E are continuously performed.

FIG. 12C illustrates an example of the second chlorine radical adsorbing step performed in the chlorine containing gas supplying area P3, in which the turntable 2 is rotated by one turn while the chlorine containing gas (the chlorine gas), the raw gas (dichlorosilane), and the nitriding gas (ammonia) are respectively supplied.

In a similar manner to the step illustrated in FIG. 12B, in the chlorine containing gas supplying area P3, the chlorine containing gas (the chlorine gas) is supplied from the reaction gas nozzle 33, and the chlorine radical is supplied from the shower head unit 93 so as to cause the chlorine radical 201 to be adsorbed onto the front surface of the wafer W including the trench T.

FIG. 12D illustrates an example of the nitriding step performed in the nitriding gas supplying area P2, in which the turntable 2 is rotated by one turn while the chlorine containing gas (the chlorine gas), the raw gas (dichlorosilane), and the nitriding gas (ammonia) are respectively supplied. In the nitriding step, the activated nitriding gas is supplied onto the front surface of the wafer W, oonto which the the chlorine radical 201 adsorbs. Said differently, the nitriding gas is supplied from the reaction gas nozzle 32 and the nitriding gas activated by the plasma generator 80 is supplied onto the front surface of the wafer W. The activated ammonia desorbs the chlorine radical adsorbing onto the flat surface of the wafer W and causes the exposed flat surface on the front surface of the wafer W to nitride so as to form a silicon nitride film 202. Thus, the silicon adsorption site is formed. On the other hand, on the bottom surface and the side surface of the trench other than the flat surface of the wafer W, even though the activated nitriding gas is supplied, the chlorine radical does not desorb so as not to perform the nitriding process. Therefore, the silicon adsorption site is not formed at a part other than the flat surface of the wafer W.

The reason why the chlorine radical desorbs on the flat surface of the wafer W in the step illustrated in FIG. 12D is described. The chlorine radical adsorbs on the surface of the wafer W by physical adsorption and is supposed to be easily blown off by ICP plasma ions. The front surface of the wafer W is nitride when the activated ammonia adsorbs onto the front surface, form which the chlorine radical desorbs. Meanwhile, at a part othere than the flat surface of the wafer W, namely on the bottom surface and the side surface, the chlorine radical does not desorbs in the nitriding process in the nitriding gas supplying area P2 does not desorb. Therefore, the bottom surface and the side surface of each trench T is not nitride. This is supposed to be that the lifetime of the ICP plasma ions to securely reach the inside of the trench T. The chlorine radical adsorbs on the bottom surface and the side surface of each trench T so as to saturate. Even if a certain amount of ammonia reaches inside the trench T, the chlorine radical cannot desorb on the inner surface of the trench T. Therefore, after the nitriding process in the nitriding gas supplying area P2, the chlorine radical continues to adsorb on the bottom surface and the side surface of each trench T. Force of blowing off the chlorine radical adsorbing onto the front surface may be adjusted by a setup of the film deposition apparatus at a time of producing the ICP plasma such as adjustment of power (antenna output) and the gap between the front surface of the turntable 2 and the lower surface of the frame member 81. For example, the setup conditions of the ICP plasma can be adjusted such that the chlorine radical on the bottom surface and the side surface of each trench T do not desorb but only the chlorine radical adsorbing on the flat surface of the wafer W desorbs.

FIG. 12E illustrates an example of the adsorbing step performed in the raw gas supplying area P1, in which the turntable 2 is rotated by one turn while the chlorine containing gas (the chlorine gas), the raw gas (dichlorosilane), and the nitriding gas (ammonia) are respectively supplied. In the raw gas adsorbing step, the raw gas containing silicon and chlorine is supplied on the front surface of the wafer W, on which the silicon adsorption site is formed on the flat surface. Said differently, dichlorosilane (DCS) is supplied from the reaction gas nozzle 31. With this, dichlorosilane as the raw gas adsorbs onto the silicon adsorption site on the flat surface of the front surface of the wafer W to form the molecular layer 203 of the raw gas. The molecular layer 203 is not subject to the nitriding process and has the front surface that is not nitride. The molecular layer 203 having the front surface that is not nitrided within the flat surface is nitrided in the nitriding step, in which the nitriding gas is supplied next. Thus, the molecular layer of the silicon nitride deposites onto the flat surface of the wafer W. At this time, chlorine radical adsorbes onto the bottom surface and the side surface of each trench T to form the adsorption blocking area. Or, although the chlorine radical is desorbed by blowing the $N_2$ purge gas supplied from the separation gas nozzles 41, 42 before and after the wafer W passes through raw gas supplying area P1, the bottom surface and the side surface of each trench T are areas where the nitriding process is not performed and the silicon adsorption site is not formed. Therefore, dichlorosilane as the raw gas do not adsorb the bottom surface and the side surface of each trench T. By this selective adsorption of the raw gas selectively on the flat surface of the wafer W, the molecular layer of the silicon nitride film is selectively deposited on the flat surface of the wafer W.

When the steps illustrated in FIGS. 12C to 12E are performed, the supply of the raw gas from the reaction gas nozzle 31 and the supply of the nitriding gas from the reaction gas nozzle 32 may start simultaneously.

As illustrated in FIGS. 2, 3, and 9, when the turntable 2 is rotated in a counterclockwise direction, the wafer W reaches the nitriding gas supplying area P2 after passing through the chlorine radical supplying area P3, and thereafter reaches the raw gas supplying area P1. Therefore, the raw gas and the nitriding gas are simultaneously started to be supplied, the raw gas adsorbing step, in which the chlorine radical on the flat surface of the wafer W is desorbed by the activated nitriding gas to form the silicon adsorption site, may be performed.

The chlorine radical adsorbs on the front surface of the wafer W with weak force so as to be easily blown off by purging $N_2$. Therefore, by blow of the $N_2$ perge gas supplied from the separation gas nozzles 41 and 42 before and after the wafer W passes therethrough, the chlorine radical adsorbing on the bottom surface and the side surface of each trench T easily desorbs. In the following steps, when the steps of selectively depositing the silicon nitride film on the flat surface of the wafer W, the step of causing the chlorine radical to be adsorbed onto the bottom surface and the side surface of each trench T is performed again.

As described above, after the first chlorine radical adsorbing step at the initial stage of the film deposition process illustrated in FIG. 12B, as illustrated in FIGS. 12C to 12E, the second chlorine radical adsorbing step in the chlorine containing gas supplying area P3, the nitriding step in the nitriding gas supplying area P2, and the raw gas adsorbing step in the raw gas supplying area P1 are continuously performed. In a case of the arrangement illustrated in FIGS. 2, 3, and 9, the wafer W on the turntable 2 is supplied with the chlorine radical P3, thereafter the nitriding gas is supplied in the second processing area P2 to desorb the chlorine radical on the flat surface of the wafer W, cause the flat surface to nitride, and form the silicon adsorption site, and the raw gas is supplied in the first processing area P1 so that the raw gas adsorbs onto the silicon adsorption site. Immediately after the raw gas adsorbs onto the flat surface of the wafer W, the third processing area P3 is started to supply chlorine radical. Therefore, after the first chlorine radical adsorbing step illustrated in FIG. 12B is performed by rotating the turntable by at least one turn in the initial stage of the film deposition process, the steps illustrated in FIGS. 12C to 12E are continuously performed without stopping the supply of the chlorine radical. One turn of the turntable 2 while supplying chlorine radical, a nitriding gas, a raw gas, and a separation gas correspond to the second chlorine radical adsorbing step illustrated in FIG. I2C, the nitriding step illustrated in FIG. 12D, and the raw gas adsorbing step illustrated in FIG. 12E. By repeating multiple cycles (one cycle corresponds to the one turn of the turntable 2), the silicon nitride film having a predetermined film thickness is deposited.

In the nitriding step illustrated in FIG. 12D, the flat surface on the front surface of the wafer W is nitrided. Then, the structure including $NH_2$ ending with hydrogens is obatainable so that the adsorption site for the raw gas is formed. In the raw gas adsorbing step illustrated in FIG. 12E, the raw gas adsorbs onto the adsorption site including $NH_2$ ending with hydrogens. Thereafter, when the chlorine radical is supplied in the second chlorine radical adsorbing step illustrated in FIG. 12C, the chlorine radical adsorbs onto the flat surface of the wafer W and the bottom surface and the side surface of the trench T on the front surface of the wafer W. As described above, because the raw gas contains chlorine, and chlorines do not mutually adsorb, the raw gas does not adsorb at a portion where the chlorine radical adsorbs. The portion, on which the chlorine radical adsorbs, becomes an adsorption blocking area where the adsorption of the raw gas is blocked.

FIG. 12F illustrates an example of the wafer W obtained after repeating the cycle of the second chlorine radical adsorbing step illustrated in FIG. 12C, the nitriding step illustrated in FIG. 12D, and the raw gas adsorbing step illustrated in FIG. 12E. In response to the number of times of the cycles including the second chlorine radical adsorbing step, the nitriding step, and the raw gas adsorbing step, the silicon nitride film 203a having a predetermined film thickness is formed.

After the film deposition ends, the supply of all gases is stopped, the plasma generators 80 and 90 are stopped, the rotation of the turntable 2 is stopped. In the order adverse to carrying in the wafer W, the turntable 2 is intermittently rotated and stopped, the wafer W is lifted up by the up-and-down pin, and the wafer W is sequentially carried out of the vacuum chamber 1. The silicon nitride film is selectively deposited on the flat surface on the front surface of the wafer W.

In the step illustrated in FIG. 12C, because the chlorine radical easily reach the front surface and the upper portion of the trench T after the initial one turn of the turntable 2, much chlorine radical adsorbs the front surface and the upper portion of the trench T but there is a case where the chlorine radical cannot easily reach the bottom surface of the trench T. In order to cause the chlorine radical to reach the bottom of the trench, there may be a case where the turntable 2 to be further rotated. Therefore, in the film deposition method for depositing the silicon nitride film of this embodiment, a time period of the chlorine radical adsorbing step for supplying only the chlorine radical and the separation gas may be made longer than the time period for the nitriding step and the raw gas adsorbing step.

Referring to FIG. 13, the nitride film deposition method for forming the silicon nitride film in a case where the time period of the chlorine radical adsorbing step is longer than the time period for the nitriding step and the raw gas adsorbing step. A case where the above film deposition apparatus is used in a manner similar to the film deposition method illustrated in FIG. 12 is exemplified. A part common to the film deposition method illustrated in FIG. 12 is omitted from the explanation. FIGS. 13A to 13G illustrate an example of a series of processes of the film deposition method according to the embodiment of the present invention.

FIG. 13A is an example of the wafer W being a target of film deposition in the film deposition method for depositing the silicon nitride film. The trench T being the minute recess is formed on the front surface of the wafer W as illustrated in FIG. 13A. This wafer W is carried in the vacuum chamber 1 of the film deposition apparatus, the inside of the vacuum chamber 1 is exhausted so as to have a process pressure, the turntable 2 is rotated at a predetermined rotation speed, and the wafer W is heated to have a predetermined temperature by the heater unit 7. Next, the activated nitriding gas is supplied from the reaction gas nozzle 32 to perform plasma reformulation on the front surface of the wafer W. Thus, the front surface of the wafer W including the inner surface of the trench T is subjected to the plasma nitridation. At a time of entering the step illustrated in FIG. 13B, the supply of the nitriding gas from the reaction gas nozzle 32.

Referring to FIG. 13B, an example of a first chlorine radical adsorbing step in the initial stage of the film deposition process is illustrated. In the first chlorine radical adsorbing step in the intial stage of the film deposition process, the supply of the nitriding gas in the nitriding gas supplying area P2 and the supply of the raw gas in the raw gas supplying area P1 are stopped, and the turntable 2 is rotated by at least one turn while the chlorine containing gas that is activated in the chlorine containing gas supplying area P3 is being supplied to the wafer W. Said differently, the chlorine containing gas (the chlorine gas) is supplied from the reaction gas nozzle 33, argon as the separation gas is spplied from the separation gas nozzles 41 and 42, dichlorosilane as the raw gas is not supplied from the reaction gas nozzle 31 and ammonia as the nitriding gas is not supplied from the reaction gas nozzle 32. When the chlorine containng gas (the chlorine gas) is supplied from the reaction gas nozzle 33, the chlorine radical is supplied from the shower head unit 93. In this state, the turntable 2 is rotated by at least one turn to cause the chlorine radical 1201 to be adsorbed on the surface of the wafer W including the trench T.

Referring to FIG. 13C, an example of a third chlorine radical adsorbing step on or after the initial stage of the film deposition process is illustrated. FIG. 13D illustrates a step of securing adsorption of a sufficient amount of chlorine radical in a case where the amount of the adsorbed chlorine radical in the second chlorine radical adsorbing step is insufficient. The supply of the nitriding gas in the nitriding gas supplying area P2 and the supply of the raw gas in the raw gas supplying area P1 are stopped, and the turntable 2 is rotated by at least one turn while the chlorine containing gas that is activated in the chlorine containing gas supplying area P3 is being supplied to the wafer W. With this, the sufficient amount of chlorine radical 1201 is caused to adsorbed onto the front surface of the wafer W including the trench T.

Referring to FIG. 13D, an example of a second chlorine radical adsorbing step on or after the initial stage of the film deposition process is illustrated. FIG. 13E illustrates an example of the nitriding step. FIG. 13F illustrates an example of the raw gas adsorbing step. The steps illustrated in FIGS. 13D to 13F are performed by rotating the turntable 2 by one turn while a chlorine containing gas activated in the chlorine containing gas supplying area P3 is supplied to the wafer W, the nitriding gas is supplied nitriding gas supplying area P2, and the raw gas is supplied to the raw gas supplying area P1. Said differently, the turntable 2 is rotated by one turn while the chlorine containing gas (the chlorine gas) is supplied from the reaction gas nozzle 33, dichlorosilane as the raw gas is supplied from the reaction gas nozzle 31, ammonia as the nitriding gas is supplied from the reaction gas nozzle 32, and argon as the separation gas is supplied from the separation gas nozzles 41, 42, By rotating the turntable 2 by one turn while the chlorine containing gas (the chlorine gas), the raw gas (dichlorosilane), and the nitriding gas (ammonia), the first chlorine radical adsorbing step illustrated in FIG. 13D, the second chlorine radical adsorbing step illustrated in FIG. 13E, and the raw gas adsorbing step illustrated in FIG. 13E are continuously performed.

FIG. 13D illustrates an example of the second chlorine radical adsorbing step performed in the chlorine containing gas supplying area P3, in which the turntable 2 is rotated by one turn while the chlorine containing gas (the chlorine gas), the raw gas (dichlorosilane), and the nitriding gas (ammonia) are respectively supplied. Each wafer W passes through the chlorine containing gas supplying area P3 only once. There may be a case where adsorption of the chlorine radical onto the chlorine radical onto the surface of the wafer W including the trench T only by this step is insufficient. However, because the third chlorine radical adsorbing step for ensuring the adsorption illustrated in FIG. 13C is previously performed, the adsorption of the chlorine radical onto the front surface of the wafer W including the trench T is sufficient.

FIG. 13E illustrates an example of the nitriding step performed in the nitriding gas supplying area P2, in which the turntable 2 is rotated by one turn while the chlorine containing gas (the chlorine gas), the raw gas (dichlorosilane), and the nitriding gas (ammonia) are respectively supplied. The activated ammonia desorbs the chlorine radical adsorbing onto the flat surface of the wafer W and causes the exposed flat surface on the front surface of the wafer W to nitride so as to form a silicon nitride film 202. Thus, the silicon adsorption site is formed.

FIG. 13F illustrates an example of the adsorbing step performed in the raw gas supplying area P1, in which the turntable 2 is rotated by one turn while the chlorine containing gas (the chlorine gas), the raw gas (dichlorosilane), and the nitriding gas (ammonia) are respectively supplied. With this, dichlorosilane as the raw gas adsorbs onto the silicon adsorption site on the flat surface of the front surface of the wafer W to form the molecular layer 203 of the raw gas. Because the bottom surface and the side surface of the trench T is the adsorption blocking area, onto which the chlorine radical adsorbs, dichlorosilane as the raw gas do not absorbs onto the bottom surface and the side surface of the trench T.

As described above, after the first chlorine radical adsorbing step of the film deposition process illustrated in FIG. 13B, the third chlorine radical adsorbing step that is ensured illustrated in FIG. 13C, the second chlorine radical adsorbing step illustrated in FIG. 13D, the nitriding step illustrated in FIG. 13E, and the raw gas adsorbing step illustrated in FIG. 13F are continuously performed. Said differently, in the step illustrated in FIG. 13C, the supply of the nitriding gas in the nitriding gas supplying area P2 and the supply of the raw gas in the raw gas supplying area P1 are stopped, and the turntable 2 is rotated by at least one turn while the chlorine containing gas that is activated in the chlorine containing gas supplying area P3 is being supplied to the wafer W. Next, the third chlorine radical adsorbing step that is ensured illustrated in FIG. 13C, the second chlorine radical adsorbing step illustrated in FIG. 13D, the nitriding step illustrated in FIG. 13E, and the raw gas adsorbing step illustrated in FIG. 13F are performed by supplying the wafer W with the activated chlorine containing gas in the chlorine containing gas supplying area P3, with the nitriding gas in nitriding gas supplying area P2, and with the raw gas in the raw gas supplying area P1 while the turntable 2 is rotated by one turn. One cycle is determined to be from the third chlorine radical adsorbing step illustrated in FIG. 13C that secures the adsoption to the raw gas adsorbing step illustralted in FIG. 13F. Multiple cycles are repeated to deposit the silicon nitride film having a predetermined film thickness.

FIG. 13G illustrates an example of the wafer W obtained after repeating the cycle of the third chlorine radical adsobing step illustrated in FIG. 13C that secures the adsorption, the second chlorine radical adsobing step illustrated in FIG. 13D, the nitriding step illustrated in FIG. 13E, and the raw gas adsobing step illustrated in FIG. 13F. In response to the number of times of the cycles including the third chlorine radical adsobing step, the second chlorine radical adsobing step, the nitriding step, and the raw gas adsobing step, the silicon nitride film 203 having a predetermined film thickness is formed.

As described, according to the film deposition method for depositing the silicon nitride film of the embodiment, the silicon nitride film can be selectively formed on the flat surface between minute recesses in the substrate that has the front surface including the flat surface and the multiple minute recesses. Referring to FIGS. 12A to 13G, an example that the silicon nitride film is deposited on the wafer W including the trenches T as the minute recesses is described. However, regardless of the shape of each minute recess and various pattern shapes including a flat surface, the silicon nitride film can be deposited selectively on the flat surface between minute recesses. In diversifying semiconductor manufacturing processes, in addition to embedding dent patterns such as a trench or a via, concerning the wafer W having surface shapes of various patterns including the flat surface, there is a need of the film deposition of selectively deposite a film on the flat surface of the wafer W. The film deposition method for depositing the silicon nitride film and the film deposition apparatus of the embodiments satisfy these requests and applicable to various usages. For example, the silicon nitride film formed on the flat surface between the trenches T of the wafer W may be used as an etching mask for the succeeding steps.

First Embodiment

Next, the film deposition method for depositing the silicon nitride film and the film deposition apparatus of this embodiment are described.

The film deposition apparatus is a turntable-type film deposition apparatus. The process conditions are a heating temperature for the wafer W of 400° C., the pressure inside the vacuum chamber 1 of 0.75 Torr, and a rotation speed of the turntable 2 of 10 rpm. The separation gas is a nitrogen gas. The flow rates of the gases are 1000 sccm from the separation gas nozzles 41 and 42, 1000 sccm from the separation gas supplying pipe 51 above the central portion, 400 sccm from the purge gas supplying pipe 72 below the central portion, and 200 sccm from the purge gas supplying pipe below the purge gas supplying pipe 73. Regarding the process gas, DCS of 1000 sccm is supplied from the reaction gas nozzle 31. Regarding the carrier gas, a nitrogen gas of 500 sccm is supplied. From the reaction gas nozzle 32, a mixed gas of argon and ammonia is supplied at a flow rate of 2000 sccm (argon 2000 sccm, ammonia 2000 sccm) after activating using a plasma generator 80 of ICP plasma. At this time, the gap between the front surface of the turn table 2 and the lower surface of the frame member 81 is set to be 60 mm for the operation. The output of the antenna of the ICP plasma is set to be 5 kw. From the shower head unit 93, the mixed gas of a chlorine gas and an argon gas having a flow rate of 4000 sccm is changed to radical and is supplied. Under the above conditions, one cycle of the chlorine radical adsorbing step, the nitriding step, and the raw gas adsorbing step is repeated by 33.1 cycles for a process time of 1986 seconds so as to deposit the film. Here, the flow rates of the chlorine gas supplied from the shower head unit 93 is changed like 0 sccm, 5 sccm, 25 sccm, 50 sccm, and 75 sccm so as to deposit the film. Before the film deposition of the silicon nitride film, an underlayer having a film thickness of 2 nm is formed. The silicon nitride underlayer is formed by conditions of the above film deposition method for depositing the silicon nitride film where the flow rate of the chlorine gas is set to 0 sccm.

FIGS. 14A-14D illustrate experimental results of the film deposition method for depositing a silicon nitride film according to the first embodiment of the present invention. FIG. 14A is a SEM image when the flow rate of the chlorine gas is 0 sccm. FIG. 14B is a SEM image when the flow rate of the chlorine gas is 25 sccm. FIG. 14C is a SEM image when the flow rate of the chlorine gas is 50 sccm. FIG. 14D is a SEM image when the flow rate of the chlorine gas is 75 sccm. FIGS. 14B to 14D are SEM images of the experimental results of the embodiments of the present invention. FIG. 14A is an SEM image according to a comparative example. As illustrated in FIG. 14A, when the flow rate of the chlorine gas is 0 sccm, the silicon nitride film is formed on the bottom surface and the side surface of the trench T in addition to the flat surface between the trenches T in the wafer W.

Meanwhile, in a case where the flow rate of the chlorine gas is 25 sccm, 50 sccm, and 75 sccm as illustrated in FIGS. 14B, 14C, and 14D, the silicon nitride film is formed on the flat surfaces between the trenches T. However, the silicon nitride film is not formed on the bottom surface and the side surface of the trench T formed in the wafer W. It is confirmed that the silicon nitride film is selectively formed on the flat surface between the trenches T in the wafer W having the trenches T according to the film deposition method for depositing the silicon nitride film of the embodiments of the present invention.

Figure 15A:
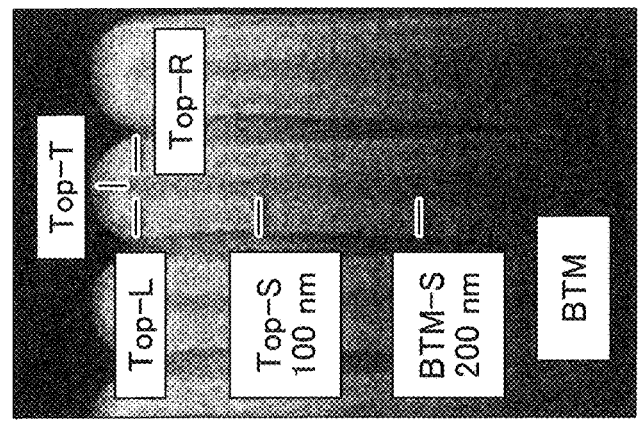
FIGS. 15A-15B illustrate the film deposition method for depositing a silicon nitride film according to the first embodiment of the present invention.
Figure 15B:
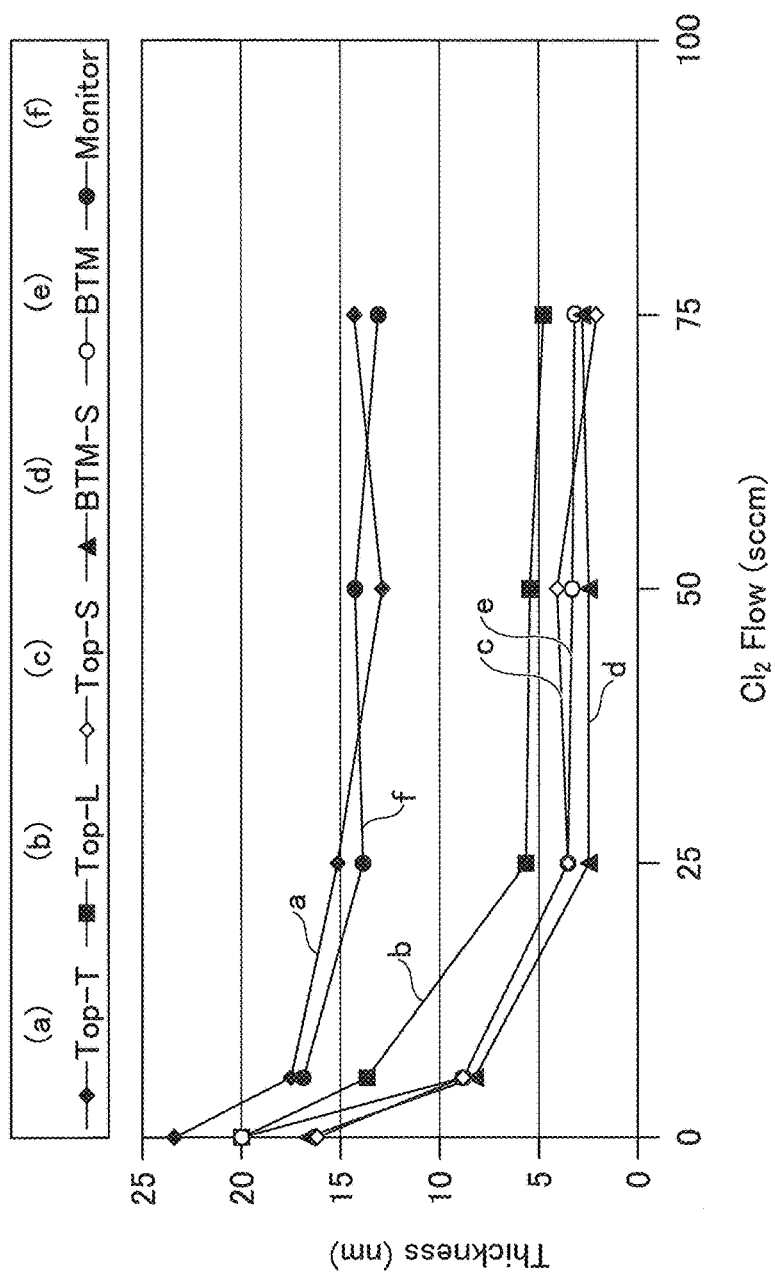

FIGS. 15A-15B illustrate the film deposition method for depositing the silicon nitride film according to the first embodiment of the present invention. FIG. 15A illustrates the positions of the trenches. Referring to FIG. 15A, a part of the flat surface of the wafer W between the upper ends of the trenches is referred to as TOP-T, the side surface on the upper right end of the trench is referred to as TOP-R, the side surface on the upper left end of the trench is referred to as TOP-L, a part on the upper side from the middle in the depth direction of the trench (the position 100 nm lower than the upper end of the trench) is referred to as TOP-S, a part on the lower side from the middle in the depth direction of the trench (the position 200 nm higher than the bottom surface of the trench) is referred to as BTM-S, and a part near the bottom surface of the trench (the position 200 nm higher than the bottom surface of the trench) is referred to as BTM.

FIG. 15B illustrates an experimental result of the film deposition method for depositing the silicon nitride film according to the first embodiment of the present invention. Referring to FIG. 15B, the horizontal axis represents the flow rate (C12 Flow) of chlorine, and indicates results in a case where the flow rate is 0 sccm, 5 sccm, 25 sccm, 50 sccm, and 75 sccm. Referring to FIG. 15B, the vertical axis represents the film thickness (nm). Referring to FIG. 15B, the result of TOP-T is indicated in (a), the result of TOP-L is indicated in (b), the result of TOP-S is indicated in (c), the result of BTM-S is indicated in (d), and the result of BTM is indicated in (e). Monitor(f) indicates the film thickness of the silicon nitride film obtained at a time of performing the film deposition process to a monitor wafer (a bare wafer in which the trench is not formed) in a manner similar to the above.

Referring to FIG. 15B, the film thickness of the silicon nitride film in TOP-T, (a) is about 23 nm when the flow rate the chlorine gas is 0 sccm. The flow rate becomes low as the gas flow increases and is constantly about 14 nm.
The film thickness of Monitor (f) is similar to the film thickness of TOP-T(a).
Referring to FIG. 15B, the film thickness of the silicon nitride film in TOP-L, (b) is about 20 nm when the flow rate the chlorine gas is 0 sccm. The flow rate becomes low as the gas flow increases and is constantly about 5 nm. Referring to FIG. 15B, the film thicknesses and is constantly about 2 nm. of the silicon nitride films in TOP-S, (b), BTM-S, (d), and BTM, (e) is about 16 to 20 nm when the flow rate the chlorine gas is 0 sccm. The flow rates become low and are constantly about 2 to 3 nm as the chlorine gas flow increases. Here, the film thickness of the silicon nitride film includes the film thickness of the silicon nitride underlayer of 2 nm. Therefore, in TOP-S, (b), BTM-S, (d), and BTM, (e), if the flow rate of the chlorine gas is at least 25 sccm, the silicon nitride is scarcely deposited on the silicon nitride underlayer. Referring to FIG. 15B, along with the increase of the flow rate of the gas, it is confirmed that the silicon nitride film is selectively formed at the positio of TOP-T.

Second Embodiment

Figure 16:
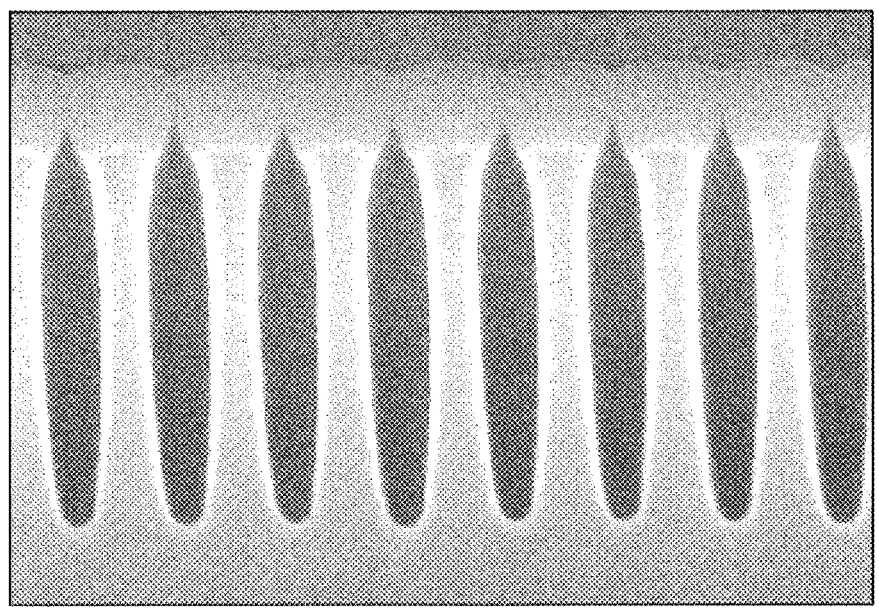
FIG. 16 illustrates an SEM image indicating an experimental result of the film deposition method according to the second embodiment of the present invention.

Within the second embodiment, the flow rate of the chlorine gas is 75 sccm, the number of cycles is 1655, the process time is 9930 seconds, and the other conditions are the same as the First Embodiment. FIG. 16 illustrates an SEM image indicating an experimental result of the film deposition method for depositing the silicon nitride film according to the second embodiment of the present invention. As illustrated in FIG. 16, by the conditions of the second embodiment, although the silicon nitride film is formed on the flat surface between the trenches T of the wafer W, the silicon nitride film is not formed on the bottom surface and the side surface of the trench T. It is confirmed that the silicon nitride film is selectively formed on the flat surface between the trenches T in the wafer W having the trenches T according to the film deposition method for depositing the silicon nitride film of the embodiments of the present invention.

For example, as a method for acquiring the chlorine radical, the plasma source such as the remote plasma is used. However, the embodiment is not limited thereto, and chlorine radical generated by thermal decomposition can be used.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the film deposition method of the present invention has been described in detail, it should be understood that various changes, substitutions, and alterations could be made thereto without departing from the spirit and scope of the invention.

What is claimed is:

1. A film deposition method for depositing a silicon nitride film of selectively depositing on a flat surface of a substrate between minute recesses, which are formed on the flat surface, the film deposition method comprising:
   a chlorine radical adsorbing step of supplying a chlorine containing gas that is activated onto a front surface of the substrate to cause the chlorine radical to be adsorbed entirely on the front surface of the substrate;
   a nitriding step of supplying a nitriding gas that is activated onto the substrate on which the chlorine radical adsorbs, causing the chlorine radical adsorbing on the flat surface, and nitride the flat surface from among the front surface of the substrate so as to form a silicon adsorption site; and
   a raw gas adsorbing step of supplying a raw gas that contains silicon and chlorine onto the substrate so as to cause the raw gas to adsorb onto the silicon adsorption site.

2. The film deposition method according to claim 1, wherein the chlorine containing gas is activated by a remote plasma generator.

3. The film deposition method according to claim 1, wherein the nitriding gas is activated by induction coupled plasma.

4. The film deposition method according to claim 1, wherein the chlorine containing gas is a $Cl_2$ containing gas.

5. The film deposition method according to claim 1, wherein the nitriding gas is a $NH_3$ containing gas or a $N_2$ containing gas.

6. The film deposition method according to claim 1, wherein the raw gas is made from dichlorosilane.

7. The film deposition method according to claim 1, wherein the minute recess is a trench or a via hole.

8. The film deposition method according to claim 1, wherein one cycle that is formed by the chlorine radical adsorbing step, the nitriding step, and the raw gas adsorbing step is repeatedly performed by multiple cycles.

9. The film deposition method according to claim 8, the film deposition method further comprises:
   a purge process for supplying a purge gas to the substrate between the nitriding step and the raw gas adsorbing step and also between the raw gas adsorbing step and the chlorine radical adsorbing step.

10. The film deposition method according to claim 8, wherein the substrate is disposed on a turntable provided in a treatment chamber along a peripheral direction of the turntable,
   wherein, inside the treatment chamber and above the turntable, a chlorine containing gas supplying area, a nitriding gas supplying area, and a raw gas supplying area are present so as to mutually separate, the chlorine containing gas supplying area being formed so as to supply the chlorine containing gas that is activated along a rotational direction of the turntable, the nitriding gas supplying area being formed so as to supply the nitriding gas that is activated to the substrate, the raw gas supplying area being formed to supply the raw gas to the substrate, wherein a cycle including the chlorine radical adsorbing step, the nitriding step, and the raw gas adsorbing step is performed while rotating the turntable.

11. The film deposition method according to claim 10, the film deposition method further comprises:

a second chlorine radical adsorbing step which, before performing the cycle including the chlorine radical adsorbing step, the nitriding step, and the raw gas adsorbing step while rotating the turntable, stops the supplying of the nitriding gas into the nitriding gas supplying area and the supplying of the raw gas into the raw gas supplying area, and rotates the turntable by at least one turn while supplying to the substrate the chlorine containing gas that is activated in the chlorine containing gas supplying area.

12. The film deposition method according to claim 11, the film deposition method further comprises:

a third chlorine radical adsorbing step which stops, between the raw gas adsorbing step and the chlorine radical adsorbing step in the step, the supplying of the nitriding gas in the nitriding gas supplying area and the supplying of the raw gas in the raw gas supplying area, and rotates the turntable by at least one turn while supplying to the substrate the chlorine containing gas that is activated in the chlorine containing gas supplying area.

13. A film deposition apparatus comprising:

a treatment chamber;

a turntable that is disposed inside the treatment chamber and includes a substrate mounting area, which is formed on a front surface of the turntable and on which a substrate can be mounted;

a chlorine containing gas supplying area that is formed on a predetermined area of the turntable so as to be capable of supplying the chlorine containing gas that is activated along a rotational direction of the turntable;

a nitriding gas supplying area that is formed on a downstream side in the rotational direction of the chlorine containing gas supplying area of the turntable so as to be capable of supplying a nitriding gas activated to the substrate;

a raw gas supplying area that is formed on a downstream side in the rotational direction of the nitriding gas supplying area of the turntable so as to be capable of supplying a raw gas containing silicon and chlorine; and a control unit configured to controlling to perform:

a chlorine radical adsorbing step as an initial stage of a film deposition process of stopping the supplying of the nitriding gas into the nitriding gas supplying area and the supplying of the raw gas into the raw gas supplying area, and supplying a chlorine containing gas that is activated onto the substrate while rotating the turntable repeated multiple cycles, each of which is formed by another chlorine radical adsorbing step, a nitriding step, and a raw gas adsorbing step, by supplying the chlorine containing gas that is activated in the chlorine containing gas supplying area onto the substrate, supplying the nitriding gas that is activated in the nitriding gas supplying area onto the substrate, and supplying the raw gas onto the substrate while rotating the turntable.

14. The film deposition apparatus according to claim 13, the film deposition apparatus further comprising:

a remote plasma generator configured to supply the chlorine containing gas that is activated into the chlorine containing gas supplying area; and a plasma generator of a type of induction coupled plasma configured to supply the nitriding gas that is activated into the nitriding gas supplying area.

\* \* \* \* \*